(12) United States Patent
Chong et al.

(10) Patent No.: US 7,489,713 B2
(45) Date of Patent: Feb. 10, 2009

(54) TUNABLE FIBER LASER LIGHT SOURCE

(75) Inventors: Changho Chong, Kasugai (JP); Atsushi Morosawa, Kasugai (JP); Tooru Sakai, Inuyama (JP)

(73) Assignee: Santec Corporation, Komaki (JP)

( * ) Notice: Subject to any disclaimer, the term of this patent is extended or adjusted under 35 U.S.C. 154(b) by 205 days.

(21) Appl. No.: 11/405,702

(22) Filed: Apr. 18, 2006

(65) Prior Publication Data

US 2006/0251131 A1    Nov. 9, 2006

Related U.S. Application Data

(63) Continuation-in-part of application No. 11/113,102, filed on Apr. 25, 2005, now Pat. No. 7,382,809.

(30) Foreign Application Priority Data

Feb. 25, 2005    (JP)    ............................. 2005-051105

(51) Int. Cl.
  *H01S 3/10* (2006.01)
  *G02B 6/00* (2006.01)
  *G02B 5/30* (2006.01)

(52) U.S. Cl. ........................... 372/20; 385/11; 359/483; 359/495

(58) Field of Classification Search ................. 359/484, 359/494–495; 385/11; 372/20
  See application file for complete search history.

(56) References Cited

U.S. PATENT DOCUMENTS

| | | | |
|---|---|---|---|
| 5,946,128 A * | 8/1999 | Paek | ........................... 359/305 |
| 6,160,826 A | 12/2000 | Swanson et al. | |
| 6,404,549 B1 * | 6/2002 | Huang et al. | ................. 359/484 |
| 6,476,967 B2 * | 11/2002 | Hu et al. | ..................... 359/484 |
| 6,914,722 B2 * | 7/2005 | Wang et al. | .................. 359/497 |
| 7,157,687 B1 * | 1/2007 | Yao | ............................. 250/216 |
| 2003/0202729 A1 * | 10/2003 | Liu et al. | ....................... 385/11 |
| 2005/0035295 A1 | 2/2005 | Bouma et al. | |
| 2006/0098205 A1 * | 5/2006 | Townley-Smith et al. | ... 356/487 |

OTHER PUBLICATIONS

Yamashita, S. et al., "Widely Tunable Erbium-Doped Fiber Ring Laser Covering Both C-Band and L-Band", IEEE Journal on Selected Topics in Quantum Electronics, Jan./Feb. 2001, pp. 41-43, vol. 7, No. 1.

* cited by examiner

*Primary Examiner*—Minsun Harvey
*Assistant Examiner*—Phillip Nguyen
(74) *Attorney, Agent, or Firm*—Smith Patent Office

(57) ABSTRACT

An optical fiber loop has a gain medium having a gain at an oscillation wavelength and optical circulators 13 and 14. Collimate lenses 22 and 24 enlarge light bean taken from the optical circulators 13 and 14. A polygon mirror 25 is provided on the light axis, and is rotated. A diffraction grating 27 is provided at the receiving position of the light reflected by the polygon mirror 25, and is of a Littrow configuration which reflects the light in the same direction as the incident light. A selected wavelength changes according to an incident angle to the diffraction grating 27, resulting in increase of selectivity owing to twice incident, thereby permitting to change an oscillation wavelength with narrow band even when changing the selected wavelength by rotating the polygon mirror 25 at high speed.

15 Claims, 21 Drawing Sheets

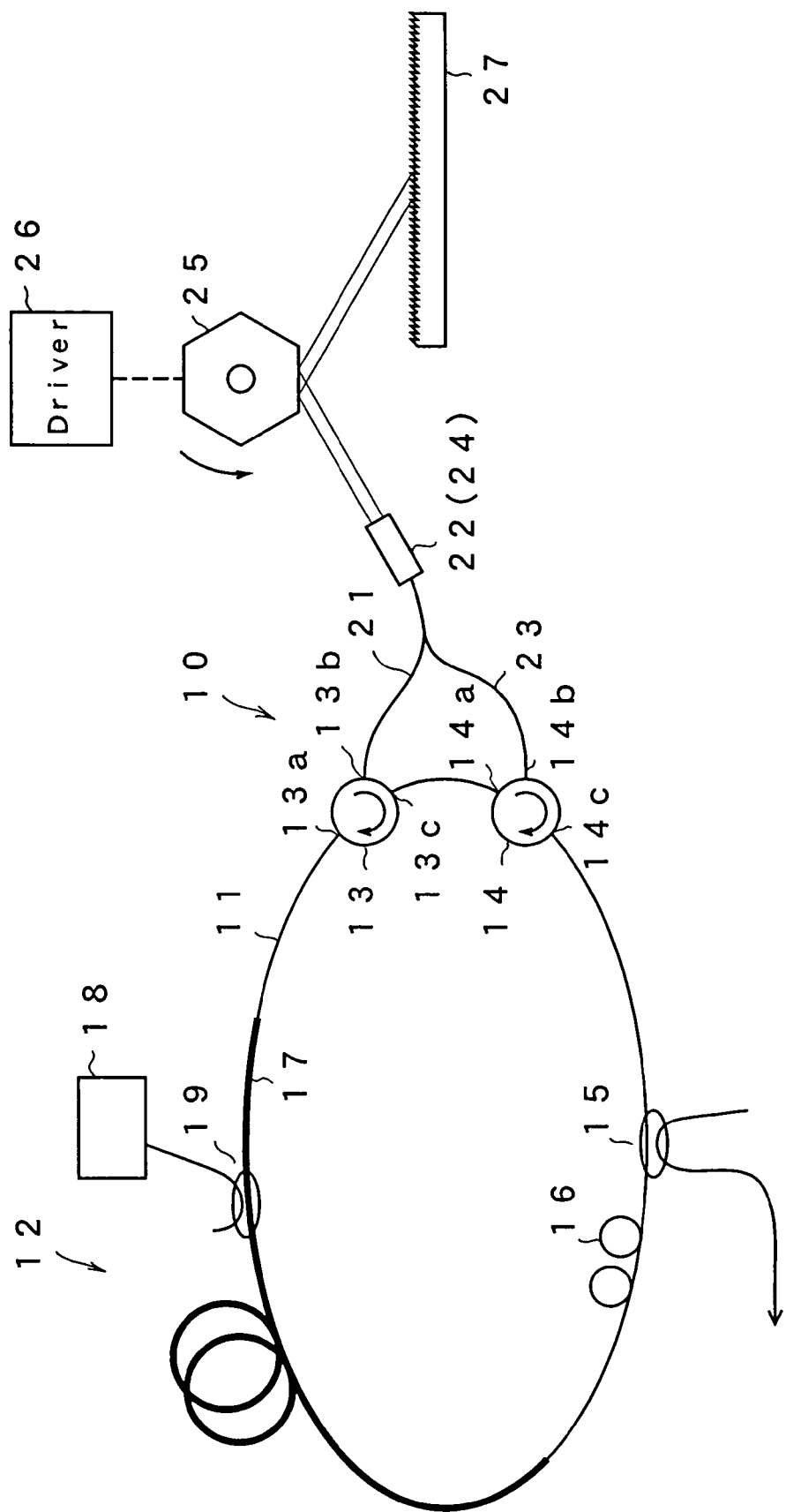

FIG. 7

| | | | | |
|---|---|---|---|---|
| $\alpha$ | ° | 30.0 | 30.0 | 30.0 |
| $\theta$ | ° | 55.0 | 57.5 | 60.0 |
| $\phi$ | ° | 34.129 | 35.287 | 36.382 |
| $\mu$ | ° | −4.129 | −5.287 | −6.382 |
| $\nu$ | ° | −6.035 | −7.731 | −9.340 |
| $\beta$ | ° | 68.000 | 68.000 | 68.000 |
| $\beta+\nu$ | ° | 61.97 | 60.27 | 58.66 |
| $M_2$ | | 1.439 | 1.512 | 1.599 |
| a | lines/mm | 1100 | 1100 | 1100 |
| $W_2$ | m | 0.00060 | 0.00060 | 0.00060 |
| $W_3$ | m | 0.00086 | 0.00091 | 0.00096 |
| $\lambda$ | nm | 1604.841 | 1578.846 | 1552.902 |
| $\Delta f$ | GHz | 29.45 | 30.06 | 30.31 |

F I G. 1 5
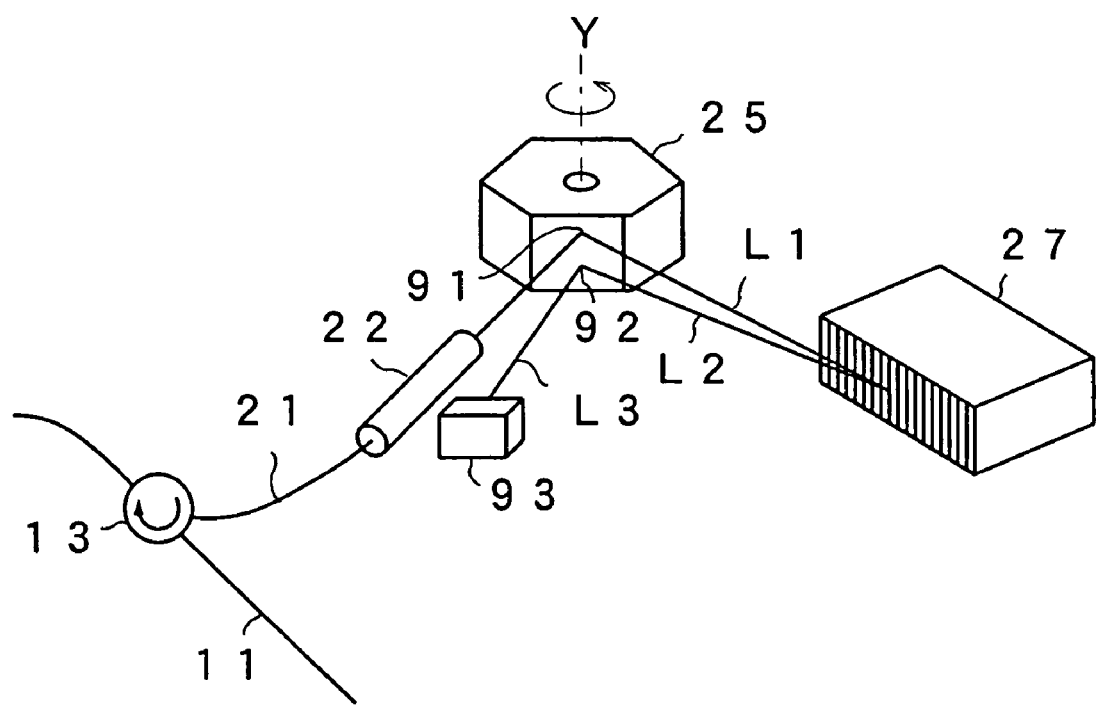

F I G. 2 2
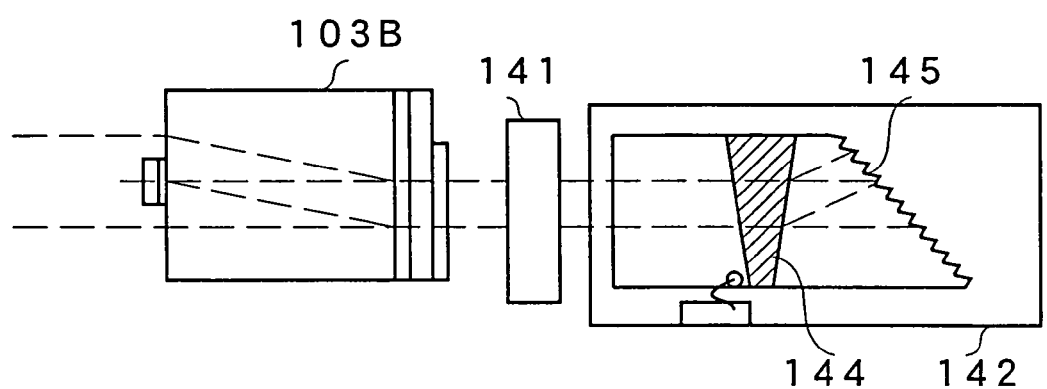

TUNABLE FIBER LASER LIGHT SOURCE

CROSS REFERENCE TO RELATED APPLICATIONS

This application is a continuation-in-part application of U.S. patent application Ser. No. 11/113,102, filed on Apr. 25, 2005, now U.S. Pat. No. 7,382,809.

BACKGROUND OF THE INVENTION

1. Field of the Invention

The present invention relates to a tunable fiber laser light source, which generates monochromatic light to periodically scan an emission wavelength thereof.

2. Discussion of the Related Art

Hitherto, as a light source of an analyzer for analyzing an object to be measured by irradiating the object with light, a light source of a wide bandwidth is used. In spectral analysis, there is widely used a method of projecting light of a wide bandwidth to an object to be measured, spatially decomposing reflection light or transmission light of the projected light to wavelength components by a grating or the like, Fourier-analyzing the frequency components by an interferometer, and making an analysis. As a light source used in such a method, for example, a white light source, an ASE light source using an erbium doped fiber (EDF), or the like is used. In such spectral analysis, however, the intensity and density of the light from the light source with respect to the wavelength is low, and those of light which is used in spectral analysis is also low. Consequently, the light source has a drawback such that even if Fourier transformation is performed, a light signal cannot be detected due to noise, and it is difficult to carry out the analysis.

Another method uses, as the light source of the analyzer, a tunable light source for emitting light of a single spectrum of high power density which is changed in a desired bandwidth. The light source emits a strong single spectrum light beam to an object to be measured while changing the wavelength of the light beam, so that the light beam passes through the object or reflection light of the light beam is directly received by a light detecting element. In the method, the intensity and density of the optical output with respect to the wavelength of the light source is high, so that the level of detected light and a S/N ratio are sufficiently high and sufficiently high measurement precision can be realized.

Conventional tunable light source includes an external cavity-type laser and fiber ring laser. The external cavity-type laser uses a gain medium such as a semiconductor laser. An external cavity is formed between one of end faces of the semiconductor laser and an external mirror, and a tunable filter formed by a grating or the like is provided in the external resonator, thereby changing the oscillation wavelength. In such a manner, a light source of the tunable type is obtained. In the external resonator-type laser light source, the length of the external resonator is relatively short as 50 mm, and the longitudinal mode interval is wide as 30 GHz. Therefore, when the wavelength of the tunable filter is simply changed, the output becomes unstable between the longitudinal modes. For example, between modes, discontinuous mode hopping occurs, or oscillation occurs in a multimode. Therefore, in order to vary the wavelength continuously in a single mode and to, moreover, make the output stable, the length of the external cavity has to be controlled finely by using such devices as a piezo-element and a complicated control is necessary. The control accompanies a mechanical operation and is performed by making the wavelength and the length of the external cavity synchronous. Consequently, the method has a drawback that it is difficult to change the wavelength at high speed.

YAMASHITA ET AL., IEEE JOURNAL ON SELECTED TOPICS IN QUANTUM ELECTRONICS, VOL. 7, NO.1 JANUARY/FEBRUARY 2001, PP41~43 shows another conventional tunable light source of a ring laser using an erbium doped fiber. The tunable light source is obtained by using the erbium doped fiber (EDF) and a fiber amplifier for exciting the erbium doped fiber as a gain medium, providing a bandpass filter of a tunable type in the optical fiber loop, and changing the wavelength of the bandpass filter. In this case, the length of a resonator of the optical fiber loop is set to be long such as several meters, so that the interval between longitudinal mode can be narrowed. Consequently, without changing the length of the resonator, the influence of mode hopping can be eliminated. Thus, although it is, strictly, not single mode oscillation, virtually continuous wavelength change can be achieved only by changing the wavelength to be selected of the bandpass filter.

When a tunable light source is used as a light source for the analyzer, it is necessary to change a wavelength at high speed and to narrow a width of an oscillation spectrum. Therefore, a corresponding characteristic is demanded for a bandpass filter. In the optical coherent tomography (OCT), for example, when the high-speed wavelength scanning can be utilized, a dynamic analysis can be performed to a high-speed image processing, bloodstream observation, variation of an oxygen saturation concentration, and the like, wherein such an analyzer is desired. However, a tunable laser light source capable of performing the high-speed scanning in such a manner as to follow an image display frame rate has not been available so far.

In the conventional filter techniques, however, it is difficult to obtain both high-speed wavelength sweep and a high Q value at the same time. For example, a tunable filter using an acoustooptic effect has a drawback such that, due to an insufficient suppression ratio at wavelengths other than the transmission wavelength, stable oscillation cannot be performed. In the case of forming a Fabry-Perot etalon by using a piezo-element as a bandpass filter, the wavelength sweep speed is as low as a few Hz or less and the case has a problem of hysteresis. In the case of using a grating for the bandpass filter, there are drawbacks such that adjustment of the optical axis is difficult and the cost is high.

SUMMARY OF THE INVENTION

The present invention has been achieved to solve such drawbacks and its object is to provide a wavelength tunable fiber laser light source capable of scanning wavelength of a light source in a narrow bandwidth at high speed.

In order to achieve the above object, a tunable fiber laser light source of the present invention comprises: an optical fiber loop which serves as an optical path of laser oscillation; a gain medium which is connected to said optical fiber loop and has a gain with respect to an oscillating wavelength; a light branch incident section which divides a plurality of light from said optical fiber loop and returns light to said optical fiber loop through the same optical path as the divided light; a tunable optical filter which receives the plurality of divided light divided by said light branch incident section, selects with each same wavelength continuously changed, and supplies light of the selected wavelength to the light branch incident section through the same optical path; and an optical coupler which is connected to said optical fiber loop and takes out a part of light passing through said optical fiber loop, wherein said tunable optical filter includes: an optical beam deflector which changes a reflecting angle of an optical beam, obtained from said light branch incident section, periodically within a certain range; and a diffraction grating which receives light deflected by said optical beam deflector and reflects light of selected wavelength changing according to an incident angle in the same direction as the incident angle.

A tunable fiber laser light source of the present invention comprises: an optical fiber loop which serves as an optical path of laser oscillation; a gain medium which is connected to said optical fiber loop and has a gain with respect to an oscillating wavelength; a light branch incident section which divides light from said optical fiber loop, and returns light to said optical fiber loop through the same optical path as the divided light; a tunable optical filter which receives the divided light divided by said light branch incident section, selects with wavelength continuously changed, and supplies light of the selected wavelength to the light branch incident section through the same optical path; and an optical coupler which is connected to said optical fiber loop, and takes out a part of light passing through said optical fiber loop, wherein said tunable optical filter includes: an optical beam deflector which reflects optical beam obtained from said light branch incident section, and changes a reflecting angle of the optical beam periodically within a certain range with a central focus on a axis; a diffraction grating which receives the light deflected by said optical beam deflector passing through a first optical path, and reflects light of selected wavelength changing according to an incident angle, the reflecting light passing through a second optical path different from said the first optical path in the same direction seen from the axis of said optical beam deflector; and a mirror which reflects light reflected at said optical beam deflector passing through said second optical path and, then, inputted passing through a third optical path by return to the third optical path.

According to the present invention having such characteristics, an optical fiber loop is used as an optical path of laser oscillation to extend an optical path length and change an oscillation wavelength by means of a tunable filter. In the tunable filter, an optical beam deflector deflects light and inputs the light to a diffraction grating. The diffraction grating, used as a filter which varies in wavelength according to an incident angle, makes light reflective in the same direction as incident light. Consequently the tunable filter constitutes a part of the optical path, so that the oscillation wavelength can be determined in response to a selected wavelength of the filter. Then, continuous change of the incident angle to the diffraction grating results in continuous change of the selected wavelength of the tunable filter, thereby enabling the oscillation wavelength to change. Sufficiently high deflection velocity of the optical beam deflector permits wavelength scanning at high speed. A plurality of times of inputting light from the same direction at the diffraction grating can provide effects to keep band width narrow even when scanning wavelength at high speed and to obtain narrow band laser light.

BRIEF DESCRIPTION OF THE DRAWINGS

FIG. 1 is a schematic view showing a tunable fiber laser light source according to a first embodiment of the present invention;

FIG. 7 is a table showing angle variations and wavelength variations;

FIG. 15 is a perspective view showing an optical beam deflector and surrounding parts according to the eighth embodiment;

FIG. 22 shows a cylindrical lens and optical waveguide element to the present embodiment in detail.

DESCRIPTION OF THE PREFERRED EMBODIMENTS

First Embodiment

Figure 2:
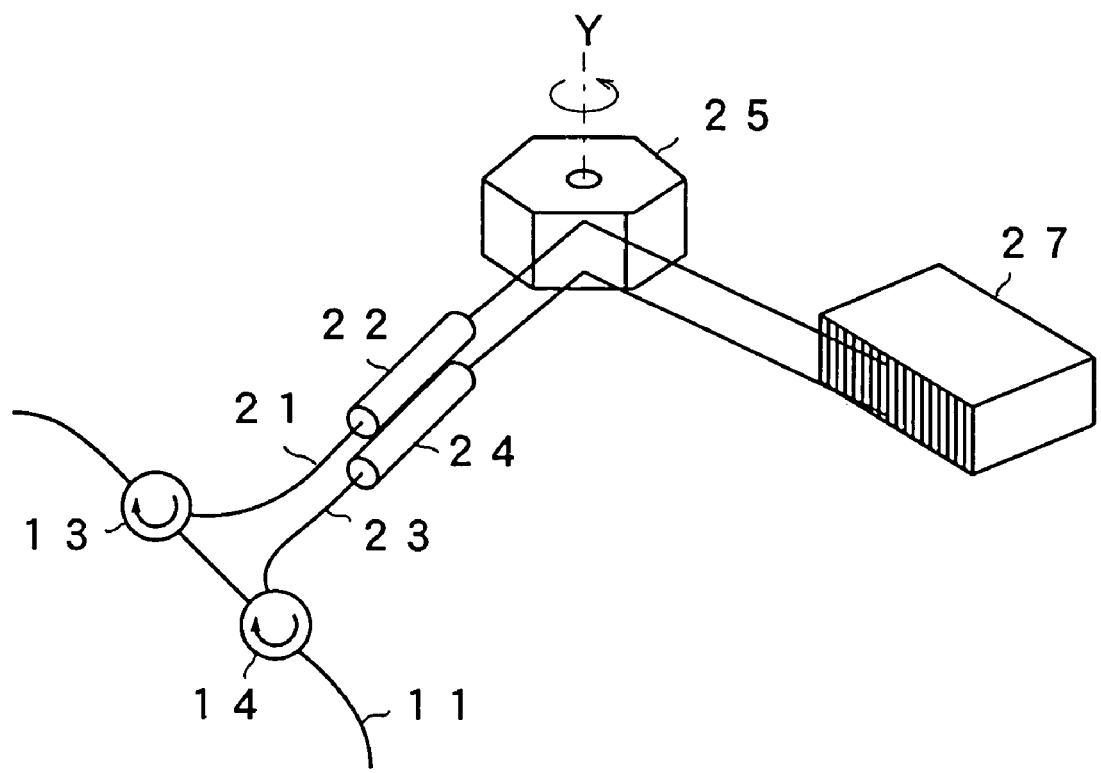
FIG. 2 is a perspective view showing an optical beam deflector and surrounding parts according to the embodiment.

FIG. 1 is a schematic view showing the configuration of a tunable fiber laser light source according to a first embodiment of the present invention. A tunable fiber laser light source 10 of this embodiment forms a loop by including an optical fiber 11. In a part of the loop, a gain medium 12, optical circulators 13 and 14, an optical coupler 15 and a polarization controller 16 are provided. The gain medium 12 has an erbium doped fiber 17 provided in a part of the optical fiber loop and doped with erbium ions ($Er^{3+}$), a semiconductor laser 18 for exciting the fiber for emitting pump light to the erbium doped fiber 17, and a WDM coupler 19. The wavelength bandwidth of the gain can be adjusted by selecting a material with which the erbium doped fiber is doped. The optical fiber loop has a length of, for example, 1 to 50 m. The semiconductor laser 18 for exciting has a wavelength of, for example, 1480 nm or 980 nm and amplifies light passing through the erbium doped fiber 17. The optical circulator 13 regulates the direction of light passing through the optical fiber 11 to the arrow direction as shown in the figure. Specifically, input terminals 13a and 13b of the optical circulator 13b are connected to the optical fiber loop and incident light from the input terminal 13a is emitted from a terminal 13b of the optical circulator 13. Incident light from the terminal 13b of the optical circulator 13 is emitted from the terminal 13c. Input terminals 14a and 14b of the optical circulator 14b are connected to the optical fiber loop and incident light from the input terminal 14a is emitted from a terminal 14b of the optical circulator 14. Incident light from the terminal 14b of the optical circulator 14 is emitted from the terminal 14c. The incident light from the terminal 14c is emitted from the terminal 14a. The optical coupler 15 extracts a part of light of the optical fiber loop, and the polarization controller 16 regulates the polarization state of light passing through the optical fiber loop to a predetermined state.

The terminal 13b of the optical circulator 13 is connected to a collimate lens 22 via an optical fiber 21 as shown in the figure. The terminal 14b of the optical circulator 14 is connected to a collimate lens 24 via an optical fiber 23 as shown in the figure. The collimate lenses 22 and 24 collimate light from each of the optical fibers 21 and 23 into parallel light, and a polygon mirror 25 with flat surfaces is provided on the optical axis. A driver 26 rotates the polygon mirror 25 along an axis perpendicular to a paper face, and the light reflected on the face of the polygon mirror is inputted into a diffraction grating 27. The diffraction grating 27 is a grating having a section with sawtooth waveform continuously formed at a constant pitch. Then, this embodiment constitutes a Littrow arrangement so that incident light returns, passing through the same optical path to a projection direction even if an incident direction changes, and a selected wavelength changes according to the incident angle. Here, the selected wavelength is set within a range from 1500 to 1600 nm, for example. The polygon mirror 25 and the driver 26 constitute an optical beam deflector which changes an angle of an optical beam periodically in a certain range. The optical beam deflector and the diffraction grating 27 constitute a tunable filter.

FIG. 2 is a perspective view showing a relationship between the collimate lens, polygon mirror and diffraction grating. As shown in the figure, if a rotation axis of the polygon mirror 25 is a Y-axis, light irradiated from each of the collimate lenses 22 and 24 is preferable to irradiate so as to adjoin in a Y-axis direction. This takes the light to be inputted into the diffraction grating 27 in the same angle and conform to wavelength selection characteristics. Accordingly, appropriate selection of a width in the Y-axis direction with respect to the polygon mirror 25 and diffraction grating 27 permits to keep the light passing through the collimate lenses 22 and 24 in the same wavelength selection characteristics.

The Littrow arrangement will be described. When the incident angle of the optical beam with respect to the diffraction grating is $\gamma$ and a reflection angle is $\delta$, diffracted light is obtained by the following expression.

$$\Lambda(\sin \gamma + \sin \delta) k\lambda \quad (1)$$

Herein, k is an order and takes values of $0, \pm 1, \pm 2 \ldots$. There are Littrow and Littmann arrangements in the diffracted light. In the Littrow arrangement, angles of the 1st order diffracted light and incident light are equal. Therefore, when $\gamma = \delta_{-1}$ in the expression (1), based on the expression (1), the wavelength of the diffracted light is determined by the following expression.

$$\lambda = 2\Lambda \sin \gamma \quad (2)$$

Herein, $\Lambda$ is a pitch (μm) of the grating, that is, an inverse number of the number of grating lines a (lines/mm) per unit length. The angles of the incident light and reflected light are not equal in the Littmann arrangement.

It is necessary to select, for a length of an optical fiber loop, such a length as to include a plurality of vertical modes in a full width at half maximum of a bandpass filter by means of the diffraction grating. The number of the vertical modes is preferably at least 10, more preferably at least 100, in fact, the more, the more preferable. However, it is necessary to extend the optical fiber in order to provide more vertical modes, which necessitates the use of an optical fiber having a length of several to tens of meters in practical use.

Figure 3A:
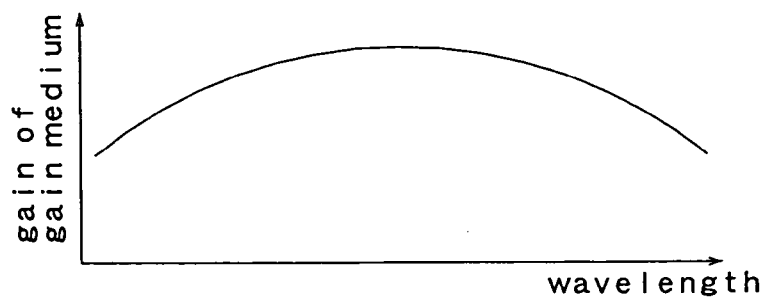
FIG. 3A is a graph showing a gain of a gain medium of an optical fiber laser light source according to the first embodiment.
Figure 3B:
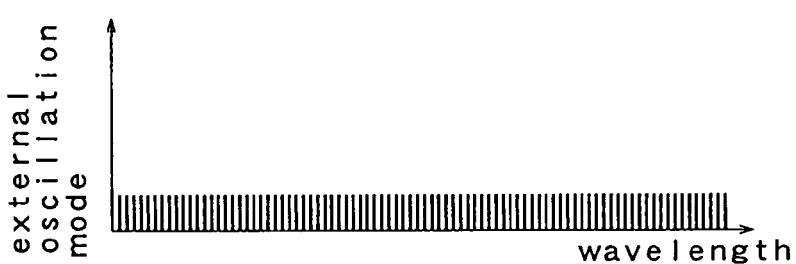
FIG. 3B is a graph showing an oscillation mode.
Figure 3C:
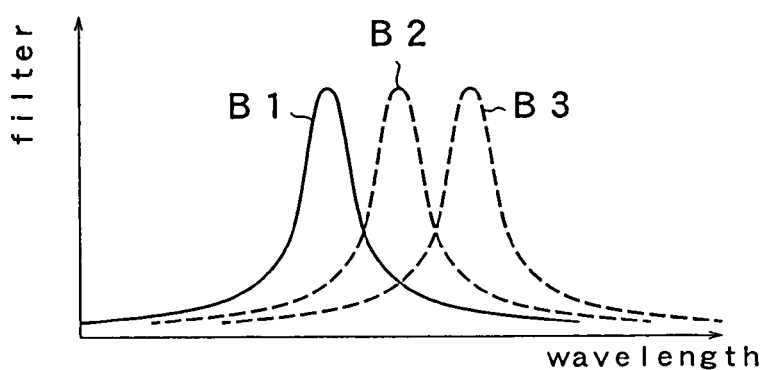
FIG. 3C is a graph showing characteristics of a band path filter.
Figure 3D:
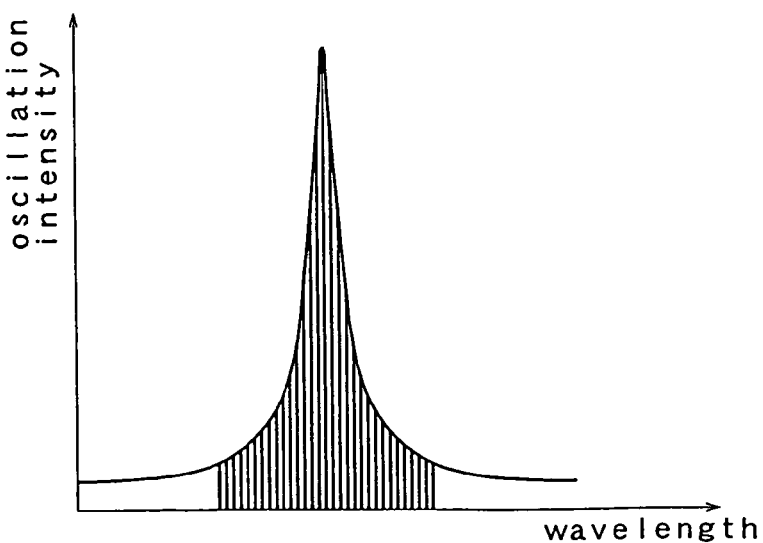
FIG. 3D is a graph showing an oscillation output.

Now, an operation of this embodiment will be described. The aforementioned semiconductor laser 18 for excitation is driven to provide pumping of an optical fiber loop via the WDM coupler 19. FIG. 3A shows a gain of the gain medium 12. Thus, operation of the optical circulator 13 causes light added from a terminal 13a to input into the optical fiber 21 from the terminal 13b, and then the collimate lens 22 collimates the light into parallel light. Then, the light reflected at an angle determined by a rotation angle of the polygon mirror 25 is added to the diffraction grating 27. The reflected light selected by the Littrow arrangement of the diffraction grating 27 is directly reflected in the same direction and is added to the collimate lens 22 via the polygon mirror 25. Further, the reflected light is added to the optical fiber loop from the optical circulator 13 via the collimate lens 22. In addition, operation of the optical circulator 14 causes light added from a terminal 14a to input into the optical fiber 23 from the terminal 14b, and then the collimate lens 24 collimates the light into parallel light. Then, the light reflected at an angle determined by a rotation angle of the polygon mirror 25 is added to the diffraction grating 27. The reflected light selected by the Littrow arrangement of the diffraction grating 27 is directly reflected in the same direction as it is, and is added to the collimate lens 24 via the polygon mirror 25. Further, the reflected light is added to the optical fiber loop by the optical circulator 14 via the collimate lens 24. A polarization controller 16 adjusts a polarization of the light transmitting through the optical fiber loop in a predetermined direction. FIG. 3B shows an external cavity vertical mode determined in accordance with an optical length decided by the length of the optical fiber loop and a refractive index of the optical fiber. For example, when the optical length is 30 m, intervals of the vertical modes becomes approximately 10 MHz. FIG. 3C shows a characteristic B1 of the diffraction grating 27. The diffraction grating 27 selects the light added twice from the collimate lenses 22 and 24 via the polygon mirror 25, thereby oscillating the light in a multiple mode with a plurality of vertical modes included as shown in FIG. 3D at the wavelength having characteristics that further includes characteristic B1 as a narrow band. The oscillation wavelength is, for example, 1550 nm. A part of the laser light thus oscillated in the optical fiber loop, for example, the light equivalent to 90% of the laser light is retrieved via the optical coupler 15. An optical signal of the multi-mode oscillation raises a problem when used as a light of optical wavelength division multiplexing communication. The optical signal, however, is acceptable as long as a spectral line width (to be strict, half-value width of an envelope of the spectrum at the time of the multi-mode oscillation) is sufficiently narrower than a resolution of a subject to be measured in the case of a spectral analysis, optical fiber sensing, evaluation of optical components. As a length of an optical fiber 11 is selected such a length that a plurality of modes, preferably at least 10 modes, more preferably at least 100 modes can stand in a full width at half maximum of the optical filter.

Figure 4:
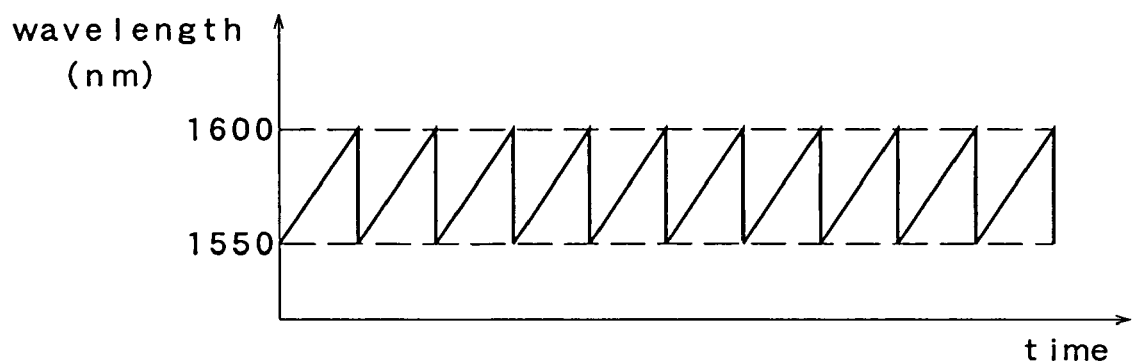
FIG. 4 is a graph showing a temporal change of an oscillation wavelength according to the embodiment.

Then, the driver 26 rotates the polygon mirror 25. This changes an incident angle to the diffraction grating 27, thereby changing the selected wavelength continuously as shown in from B1 to B3 in FIG. 3C. Therefore, rotation of polygon mirror 25 causes the oscillation wavelength to change into sawtooth waveform as shown in FIG. 4. In this case, the rotation of polygon mirror 25 permits the selected wavelength to change at high scanning velocity within a range of 50 nm, for example. For instance, if the rotation velocity of the polygon mirror 25 is 30000 rpm and the number of reflecting faces of the polygon mirror 25 is 12, the oscillation wavelength of the fiber laser light source changes at a scanning velocity of 15.4 KHz.

The oscillation according to this embodiment becomes an oscillation in the multiple mode manner as shown in FIG. 3D. Here, the intervals between the vertical modes are extremely narrow as shown in FIG. 3B, when a wavelength is changing, the oscillation mode is continuously shifted in an envelope shape. The wavelength can be thus continuously changed without mode hopping. The mode hopping, which causes unstable state of an output, is seen in a conventional semiconductor laser of an external cavity type for a single-mode oscillation. Further, when scanning at high speed, a central wavelength of the filter shifts on the long wavelength side according to a time that the light turns the entire optical fiber loop, and selecting characteristic broadens. In addition, an oscillation velocity of the suppressed vertical mode cannot follow the shift of wavelength; thus, an output spectrum broadens. However, in this embodiment, the light passes through the tunable filter twice, thereby allowing the bandwidth to keep narrow even when scanning at high speed.

Second Embodiment

Figure 5:
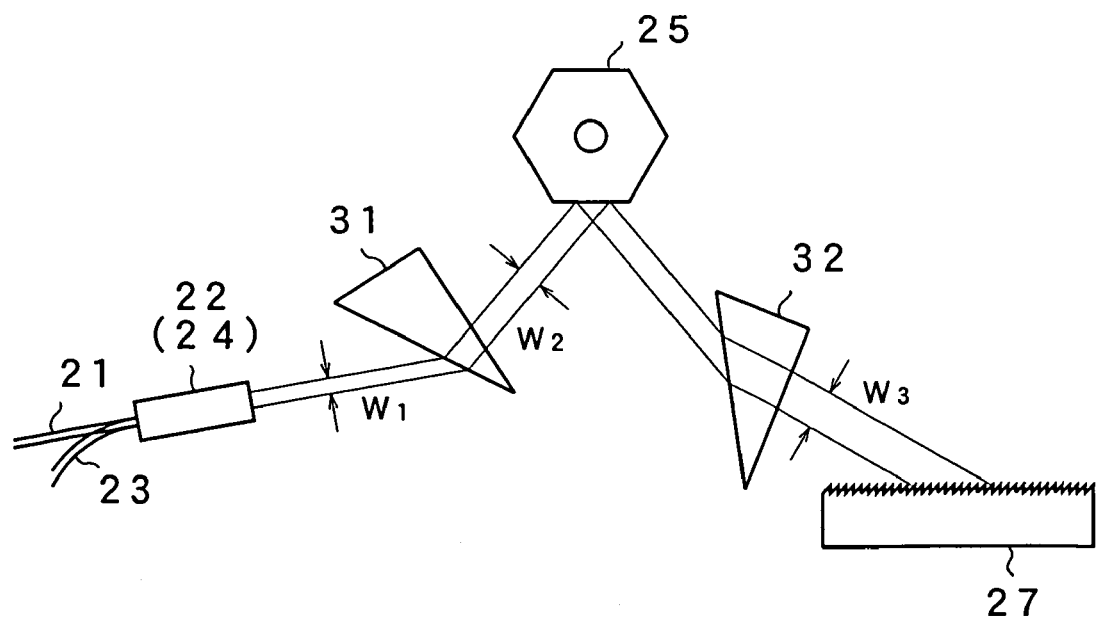
FIG. 5 is a schematic view showing a part of a tunable filter of a tunable fiber laser light source according to a second embodiment of the present invention.

Next, a second embodiment of the present invention will be described. There is no difference between the present embodiment and the first embodiment in terms of the optical fiber loop, and the structure from the circulator 13 to the optical fibers 21 and 22, and collimate lenses 23 and 24. In the present embodiment, an optical beam diameters of the light emitted from the collimate lenses 23 and 24 are expended as shown in FIG. 5. When a beam diameter of an optical beam from the collimate lenses 23 and 24 are $W_1$, the optical beam diameters are enlarged to $W_2$ by a beam expander 31 having a prism shape as shown in FIG. 5. The light reflected in the polygon mirror 25, the optical beam diameters of which are further enlarged to $W_3$ by a beam expander 32, is added to the diffraction grating 27. The optical beam diameters of the incident light with respect to the diffraction grating 27 can be thus enlarged.

Figure 6:
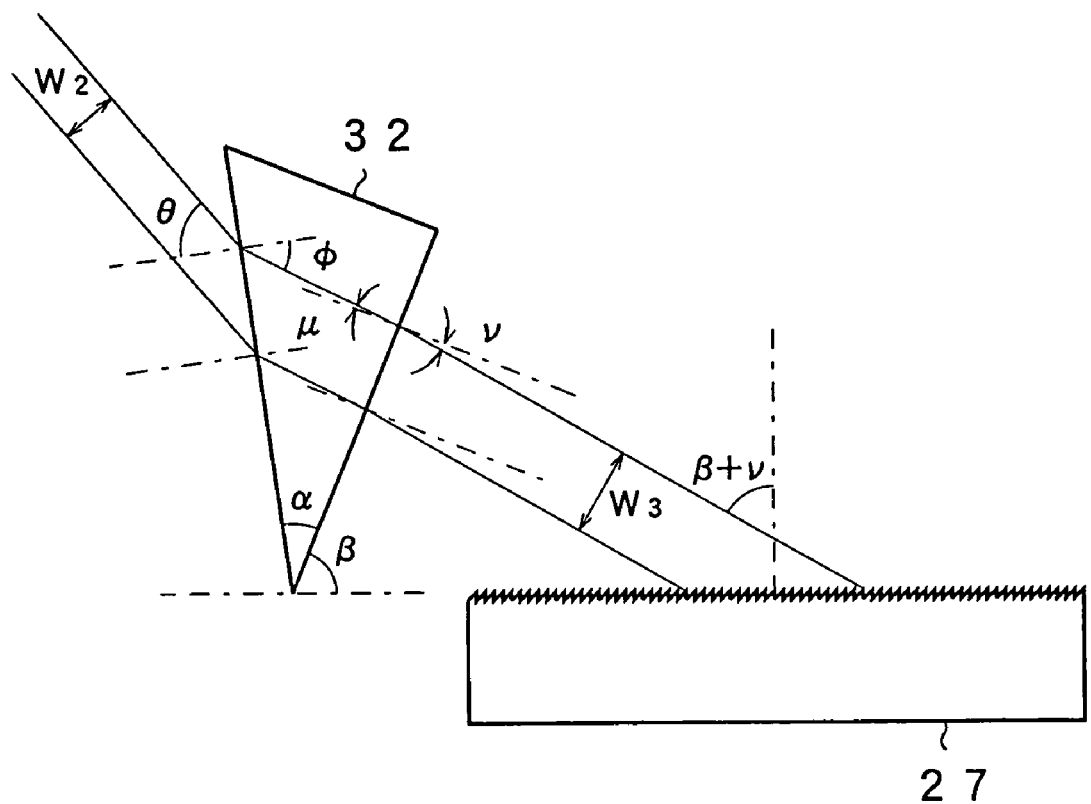
FIG. 6 is an enlarged view showing a beam expander 32 and a diffraction grating 27.

FIG. 6 is an enlarged view of the beam expander 32 and the diffraction grating 27, wherein an incident angle and a refraction angle with respect to a first surface of the beam expander 32 are respectively $\theta$ and $\phi$, and an incident angle and a refraction angle with respect to a second surface of the beam expander 32 are respectively $\mu$ and $\nu$. An apex angle of a prism of the beam expander 32 is $\alpha$, and the prism is disposed at an angle position of $\beta$ relative to the diffraction grating 27. In this case, the incident angle with respect to the diffraction grating 27 is $\beta+\nu$ because of the refraction shown in the figure. A wavelength $\lambda$ selected by the diffraction grating 27 is represented by the following expression.

$$\lambda = 2\Lambda \sin(\beta+\nu) \quad (3)$$

Herein, $\Lambda$ is a pitch (μm) of the diffraction grating and an inverse number of a constant (lines/mm) of a diffraction grating constant a. A bandwidth in Full-Width-Half-Maximum (FWHM) $\Delta\lambda$ of the wavelength selected by the diffraction grating is obtained by the following expression.

$$\Delta\lambda = \lambda^2 / \{2\pi W \tan(\beta+\nu)\} \quad (4)$$

Herein, W is an optical beam diameter of the light added to the diffraction grating 27, and $(\beta+\nu)$ is an incident angle with respect to the diffraction grating. As is clear from the expression (3), the selected wavelength is longer as the incident angle is larger, while the small incident angle results in short wavelength. As shown in FIG. 6, when the incident angle is larger, the optical beam diameter projected on the surface of the diffraction grating is also larger. Therefore, when it is assumed that the $\lambda^2$ is substantially constant, the bandwidth $\Delta\lambda$ is wider as the wavelength is shorter.

In order for the bandwidth to be constant, the optical beam diameter W of the incident light is changed in accordance with the wavelength. The beam expander 31 serves to enlarge an original optical beam diameter $W_1$ of the incident light to $W_2$. The beam expander 32 serves to enlarge the optical beam diameter $W_2$ obtained via the polygon mirror 25 to $W_3$. When the enlarged optical beam diameter $W_3$ is provided for the above expression (4) as a replacement, the half-value width is determined. The optical beam diameter $W_3$ obtained by the beam expander 32 is given from the following expression when an enlargement rate is $M_2$.

$$W_3 = M_2 W_2 \quad (5)$$

The enlargement rate $M_2$ is obtained from the following expression.

$$M_2 = (\cos\phi \cdot \cos\nu)/(\cos\theta \cdot \cos\mu) \quad (6)$$

The beam expander 31 also enlarges the beam diameter in the same manner, thereby the original optical beam diameter $W_1$ is eventually enlarged to $W_3$.

Figure 8:
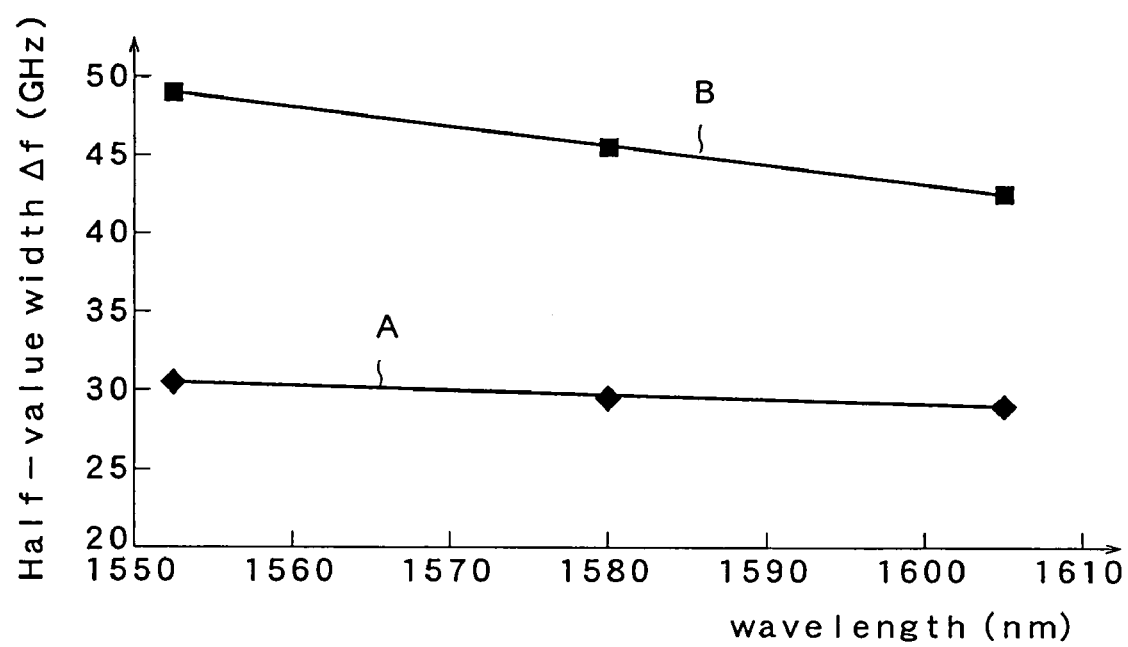
FIG. 8 is a graph showing variations relative to wavelengths of half-value width depending on the presence/absence of the beam expander.

FIG. 7 is a table showing angle variation and wavelength variation. FIG. 8 is a graph, which is drawn up based on FIG. 7, showing a variation of the half-value width (line segment A) relative to the wavelength when the beam expander 32 is used and a variation of the half-value width (line segment B)

relative to the wavelength when the optical beam is directly inputted to the diffraction grating via the polygon mirror 25 without using the beam expander 32. In the graph, the bandwidth is denoted by Δf (GHz). When the beam expander is used to thereby appropriately set the angle, the bandwidth can be constantly maintained irrespective of the selected wavelength as shown in the figure.

Third Embodiment

Figure 9:
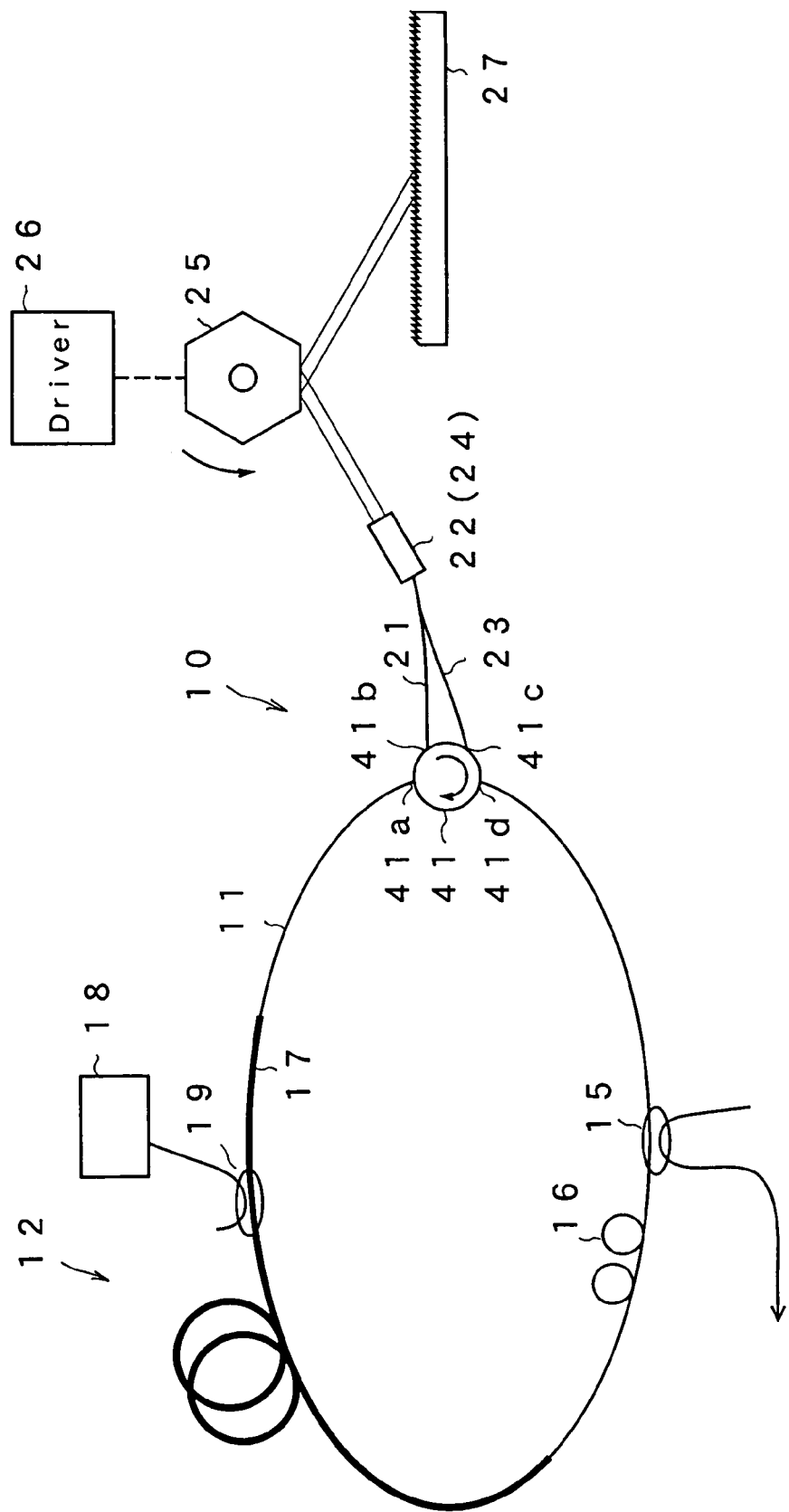
FIG. 9 is a schematic view showing a tunable fiber laser light source according to a third embodiment of the present invention.

FIG. 9 is a view showing a tunable fiber laser light source according to a third embodiment of the present invention. This embodiment uses a four-port type optical circulator as a light branch incident section in place of two three-port type optical circulators. The four-port type optical circulator 41 has terminals 41a and 41d connected to the optical fiber loop. Light inputted from the terminal 41a is emitted to a terminal 41b of the optical circulator. The light inputted from the terminal 41b is emitted from a terminal 41c. The light inputted from the terminal 41c is emitted from the terminal 41d. The light inputted from the terminal 41d is emitted from the terminal 41a. Consequently, this embodiment can use the four-port type optical circulator 41 as the light branch incident section in place of two optical circulators 13 and 14 of the first embodiment. Other construction is the same as in the first embodiment. In this case, the rotation of the polygon mirror 25 along the axis perpendicular to the paper face makes the reflected angle change, thereby allowing scanning of an oscillation wavelength.

Fourth Embodiment

Figure 10:
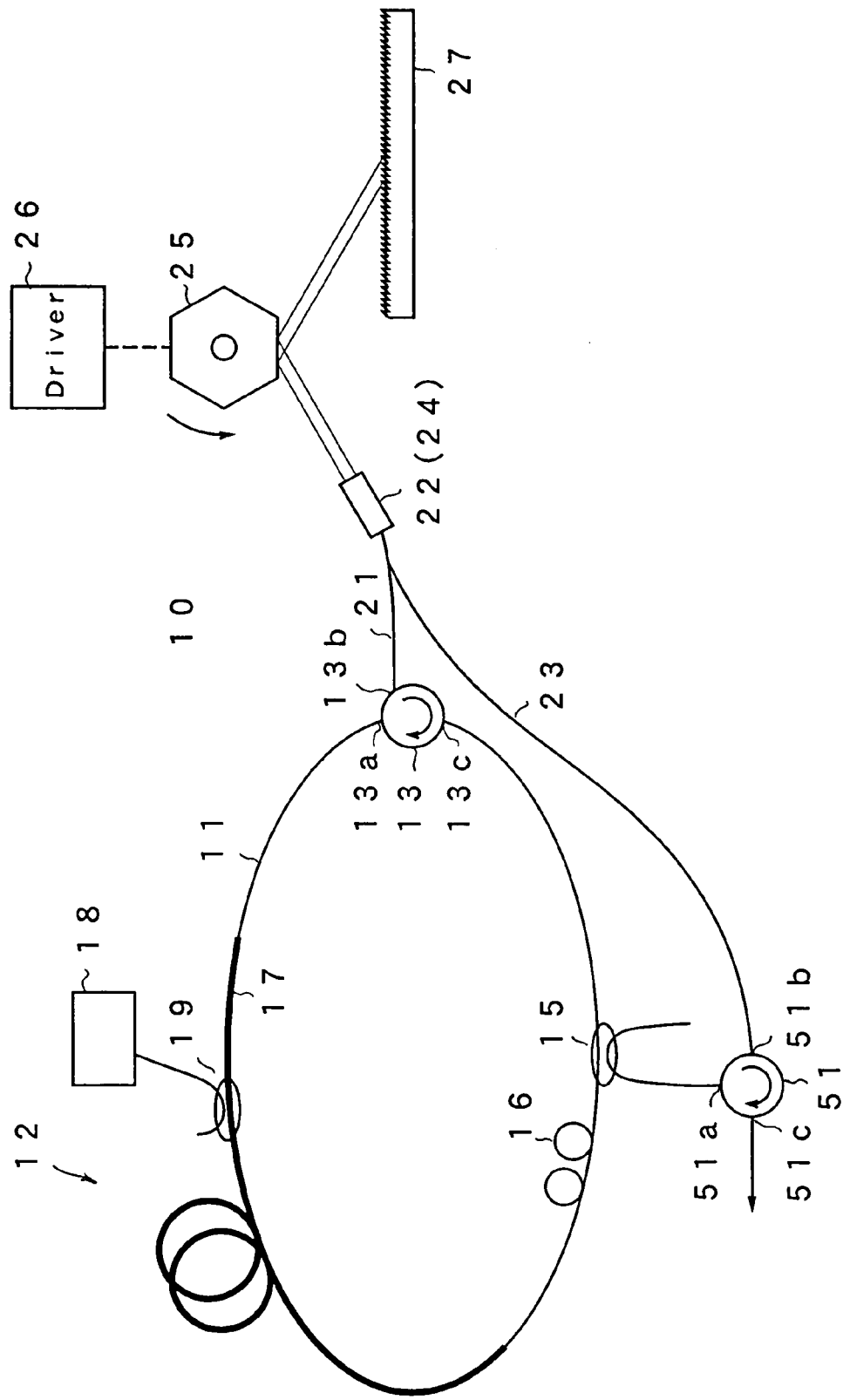
FIG. 10 is a schematic view showing a tunable fiber laser light source according to a fourth embodiment of the present invention.

FIG. 10 is a view showing a tunable fiber laser light source according to a fourth embodiment of the present invention. This embodiment inserts only the aforementioned three-port type optical circulator 13 in the optical fiber loop, and disposes a third optical circulator 51 on an output side of the optical coupler 15. Other construction is the same as in the first embodiment. That is, the optical coupler 15 takes out a part of light turning through the optical loop to input to the collimator 24 via the optical fiber 23. This allows obtaining the same effect as in the first embodiment.

Further, this embodiment may use the optical circulator 51 in addition to the two circulators 13 and 14 as in the first embodiment. Further, this embodiment may use the optical circulator 51 in addition to the four-port type optical circulator 41 as in the third embodiment to input the light into the polygon mirror. These cases can enhance wavelength selectivity by inputting three parallel optical beams into the polygon mirror 25 and the diffraction grating 27.

Fifth Embodiment

Figure 11:
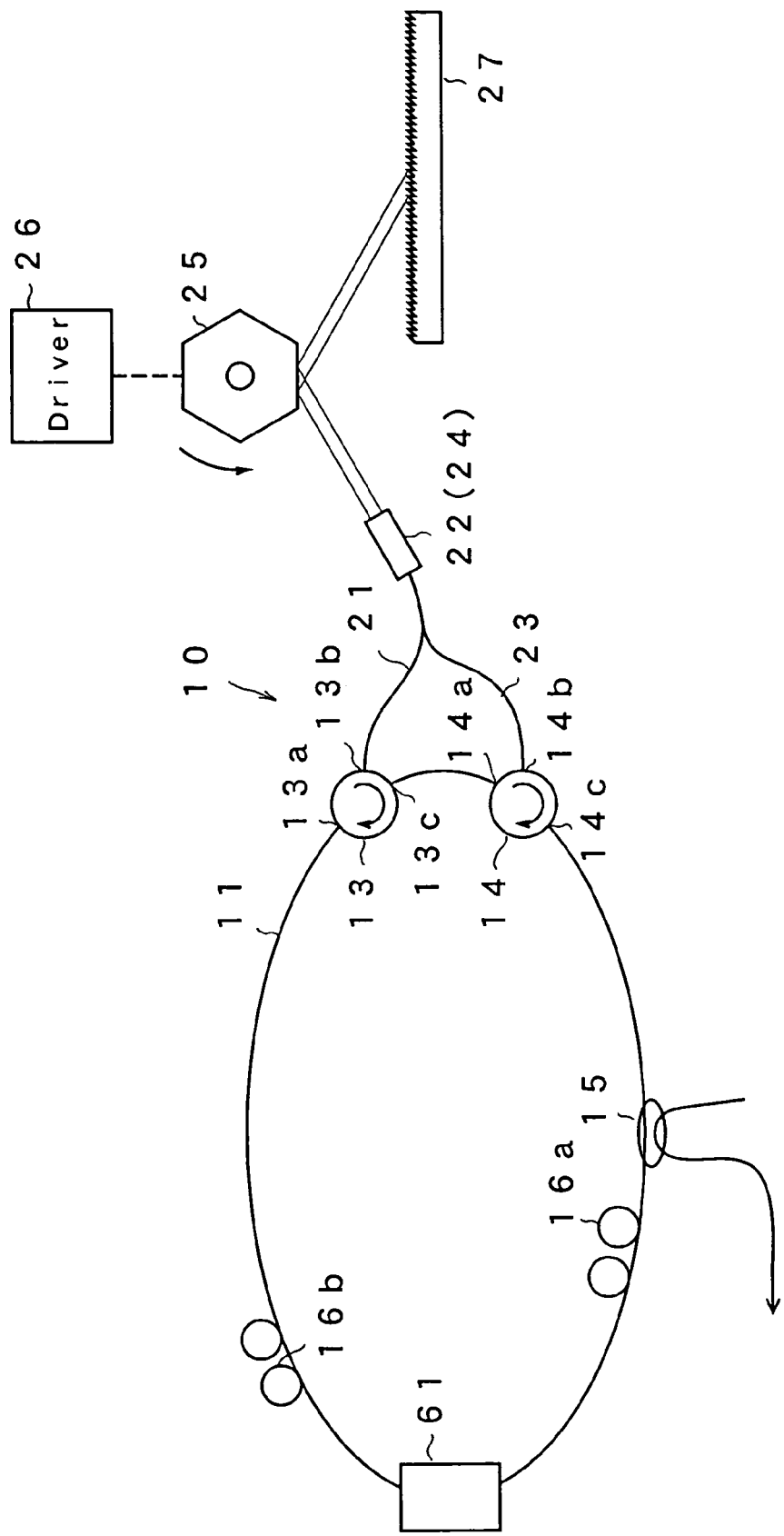
FIG. 11 is a schematic view showing a tunable fiber laser light source according to a fifth embodiment of the present invention.

FIG. 11 illustrates a tunable fiber laser light source according to a fifth embodiment of the present invention. In the present embodiment, a semiconductor optical amplifier (SOA) 61 is used as the gain medium in part of the optical fiber loop. The fiber loop is formed only by means of the regular optical fiber 11. Further, polarization controllers 16a and 16b are inserted into the fiber loop. The rest of the constitution is the same as in the first embodiment. Further, in the same manner as in the first embodiment, the optical fibers 22 and 23, collimate lenses 23 and 24, polygon mirror 25 and diffraction grating 27 are connected via the optical circulators 13 and 14. In the manner, the fiber laser oscillates can be obtained at the wavelength in response to the incident angle with respect to the diffraction grating 27 as in the above-mentioned embodiment. Then, the oscillation wavelength can be changed at high speed by rotating the polygon mirror 25. In the present embodiment, the bandwidth can be narrowed by changing the width of the optical beam in accordance with the incident angle by means of the beam expander. A gain medium 71 may be a semiconductor optical amplifier (SOA), Fabry-Perot semiconductor laser (FPLD), super luminescent laser diode (SLD) or the like.

Sixth Embodiment

Figure 12:
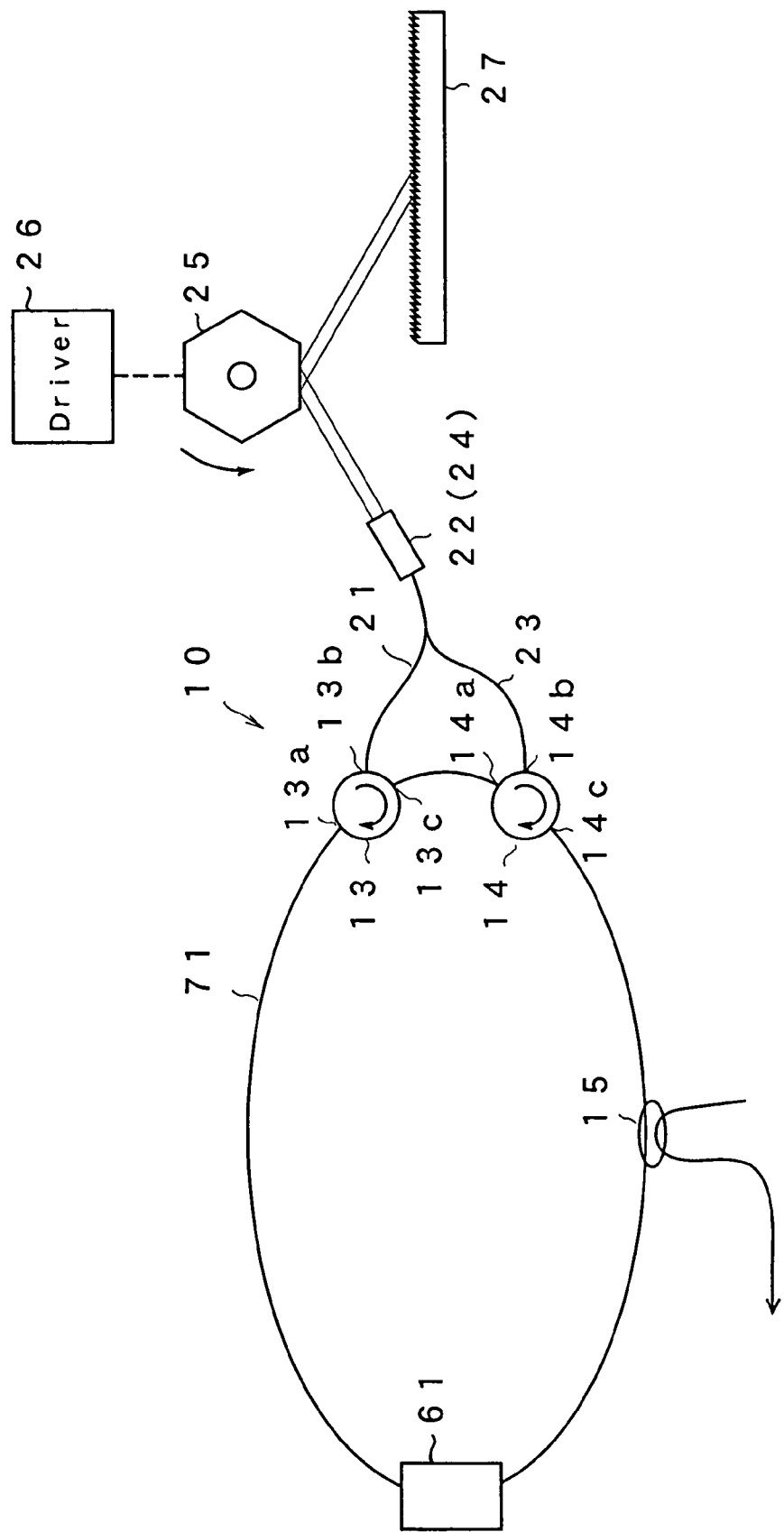
FIG. 12 is a schematic view showing a tunable fiber laser light source according to a sixth embodiment of the present invention.

FIG. 12 illustrates a tunable fiber laser light source according to a sixth embodiment of the present invention. In the present embodiment, an optical fiber 71 of a polarization maintaining type is used for the optical fiber loop to thereby form a loop of the fiber laser light source. As in the fifth embodiment, the semiconductor optical amplifier 61 is used as the gain medium in the present embodiment. Further, the optical circulators 13 and 14 and the optical coupler 16 are also used in the same manner as in the fifth embodiment. In the present embodiment, a polarization state of the light circulated in the loop and oscillated is constant in a predetermined direction because the optical fiber 71 is the polarization maintaining type fiber (PMF). The rest of the constitution is the same as in the mentioned embodiment, wherein a same effect can be obtained in a relatively simple constitution.

Seventh Embodiment

Figure 13:
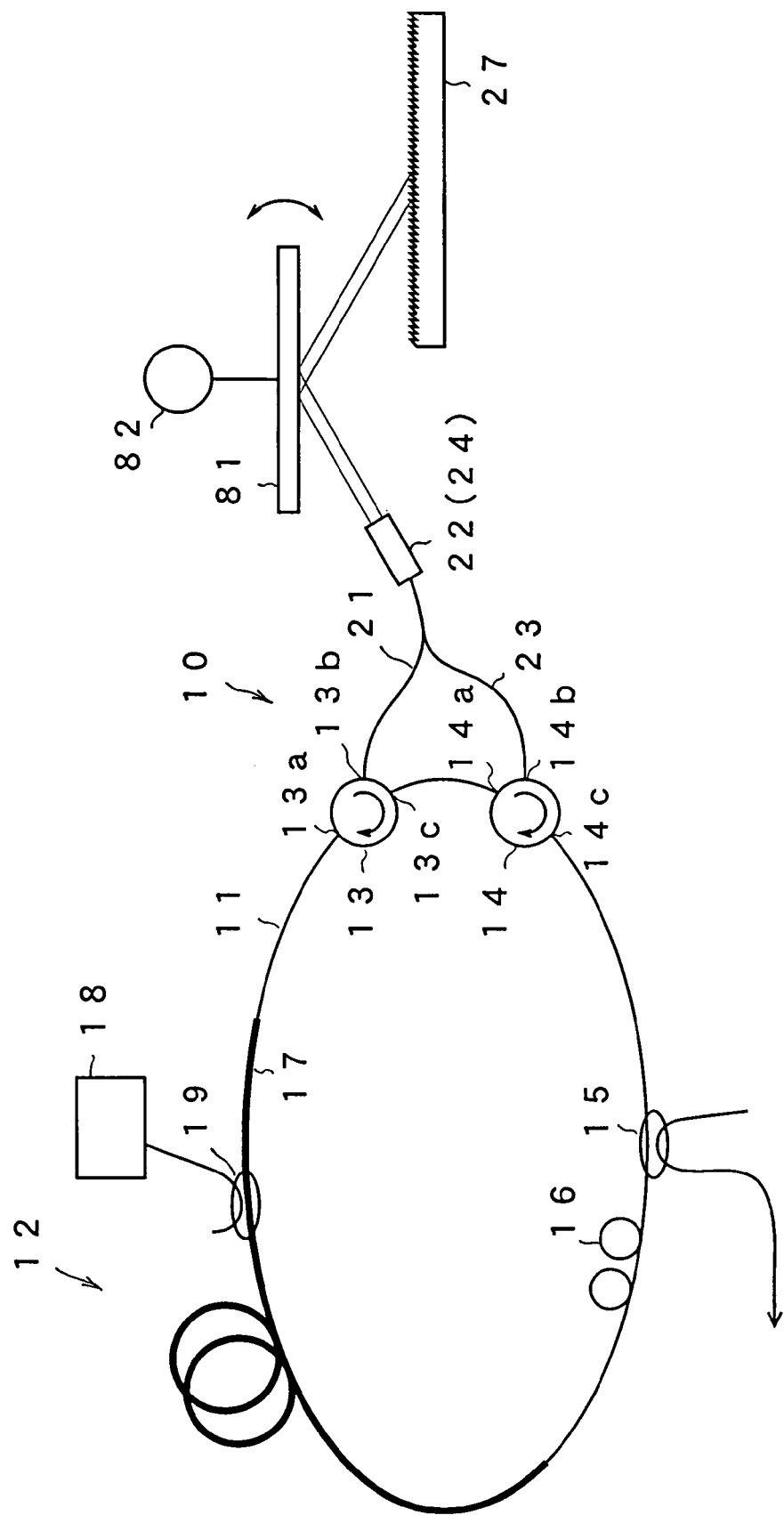
FIG. 13 is a schematic view showing a tunable fiber laser light source according to a seventh embodiment of the present invention.

Next, a seventh embodiment according to the present invention will be described with reference to FIG. 13. This embodiment uses a planar type mirror 81 and a galvanometer 82 for pivoting the mirror as the optical beam deflector. The galvanometer continuously pivots the planar type mirror 81 within a constant angle. This can deflect the optical beam to change a wavelength as in the case of using the polygon mirror. In this case, change in wavelength with respect to time is not a sawtooth waveform, but a triangular or sinusoidal waveform.

This embodiment uses two optical circulators to input light to the optical beam deflector such as the polygon mirror at the same time, but may use more than three optical circulators to collimate the light into parallel light and input to the optical beam deflector. Accordingly, the use of the same tunable filter improves wavelength selectivity.

Eighth Embodiment

Figure 14:
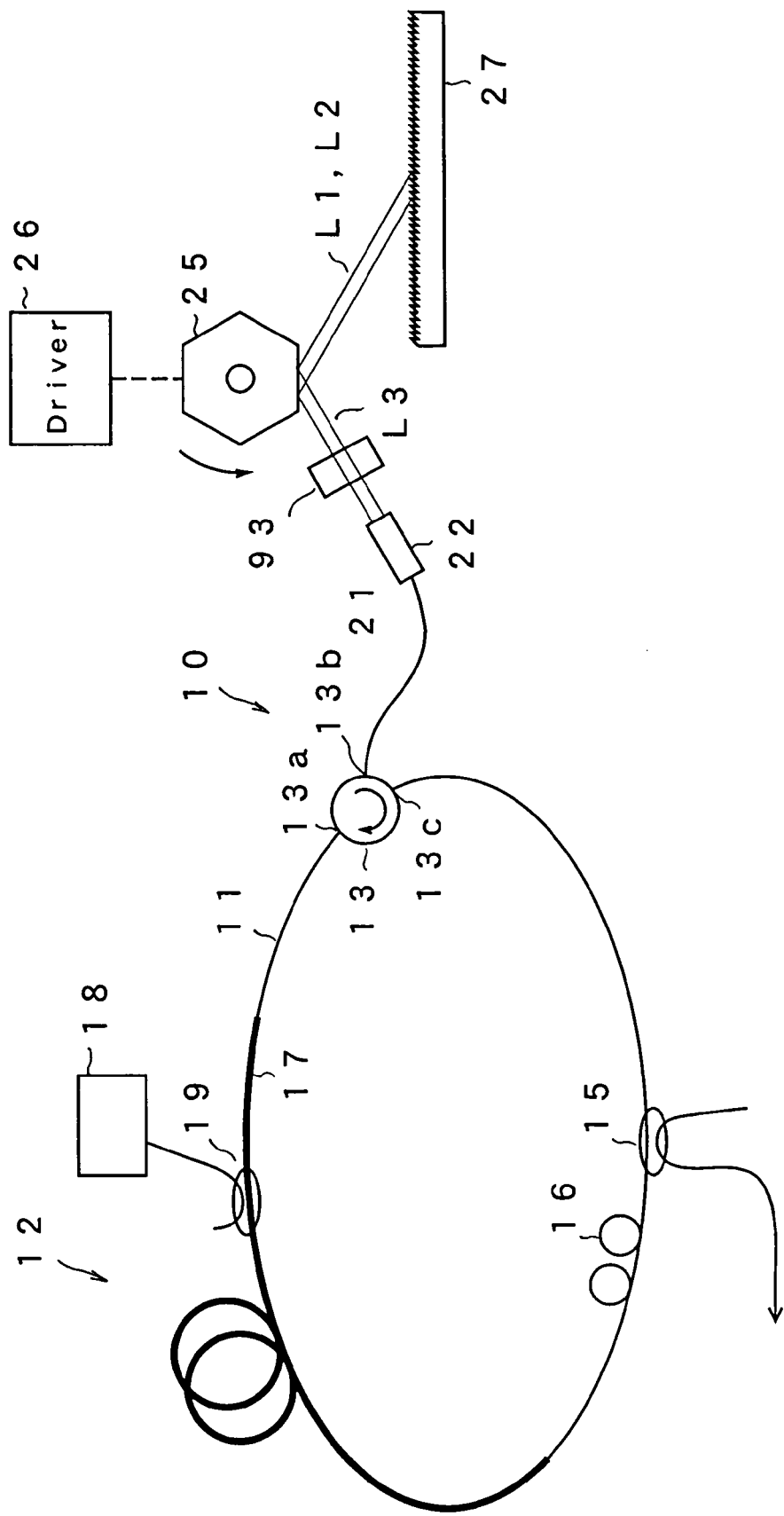
FIG. 14 is a schematic view showing a tunable fiber laser light source according to an eighth embodiment of the present invention.

Next, an eighth embodiment according to the present invention will be described with reference to FIGS. 14 and 15. This embodiment only uses the optical circulator 13 as a light branch section to input the light emitted from the optical circulator 13 into a collimate lens 22. Configuration and arrangement of the collimate lens 22, a polygon mirror 25 and a diffraction grating 27 is the same as in the first embodiment. FIG. 15 is a perspective view showing this state. This embodiment tilts an optical path of light, emitted from the collimate lens 22 to the polygon mirror 25, slightly with respect to a plane perpendicular to the Y-axis compared to the first embodiment. Then, if an optical path of light reflected at the polygon mirror 25 is a first optical path L1, the light is inputted to the diffraction grating 27 through the optical path L1. The diffraction grating 27 reflects the light of selected wavelength to a second optical path L2 which differs from the first optical path L1. The first and second optical paths L1 and L2 are the same optical path where within a plane perpendicular to the Y-axis shown in FIG. 14. In this case, as shown in FIG.

15, optical spots 91 and 92 inputted to the polygon mirror 25 are along the Y-axis. This makes the configuration the aforementioned Littrow arrangement seen from the plane perpendicular to the Y-axis shown in FIG. 14. Now, the light inputted to the polygon mirror 25 through the second optical path L2 reflects and inputs to a mirror 93 via a third optical path L3. The mirror 93 directly reflects the inputted light to the polygon mirror 25 via the third optical path L3. Accordingly, the light reflected at the polygon mirror 25 is inputted to the diffraction grating 27 again via the second optical path L2. Light of newly selected wavelength is inputted to the polygon mirror 25 via the first optical path L1, then, the light returns to the optical fiber 21 from the collimate lens 22 through the same path as the incident light. Thus the light returns to the optical fiber loop. Further, when the polygon mirror 25 rotates, the first and second optical paths L1 and L2 change, but the third optical path L3 does not change. Other configuration is the same as the aforementioned first embodiment. In this case, the light inputted to the diffraction grating also is reflected twice, resulting in improving the wavelength selectivity.

The aforementioned respective embodiments use the galvanomirror and polygon mirror as the optical beam deflector, but those that can change the reflection angle at high speed may be used and it is not to limit to those configurations.

Ninth Embodiment

Figure 16:
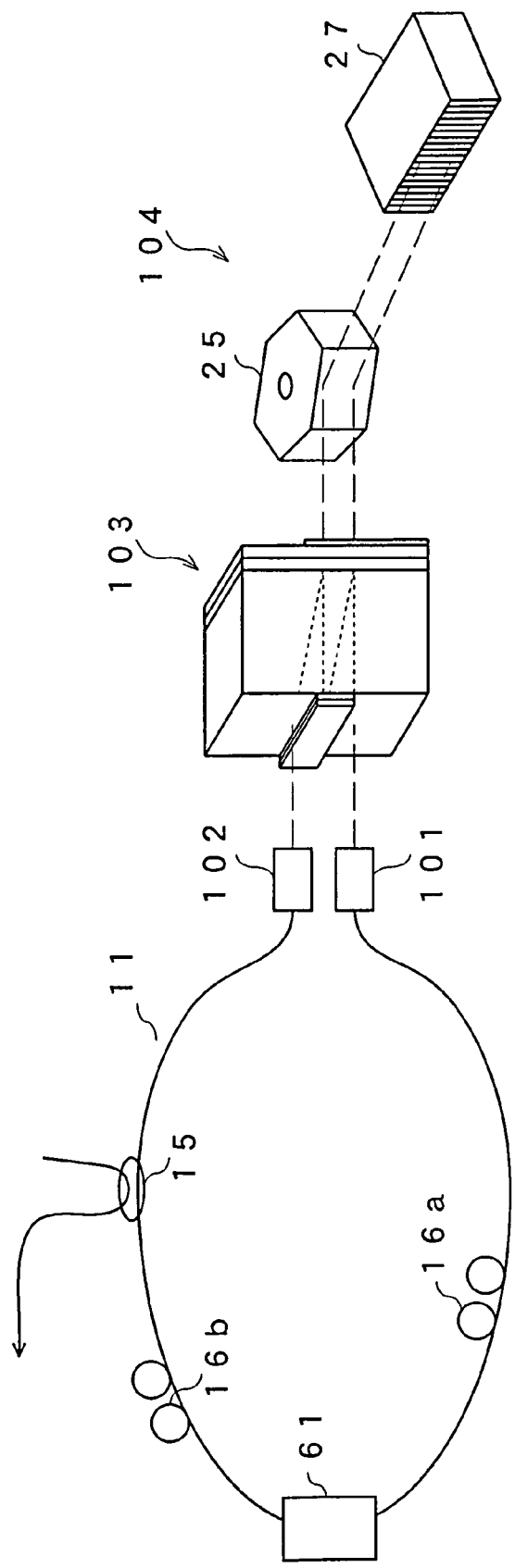
FIG. 16 is a schematic view showing a tunable fiber laser light source according to a ninth embodiment of the present invention.

Next, a ninth embodiment of the present invention will be described. FIG. 16 is a schematic view showing overall configuration of a tunable fiber laser light source according to this embodiment. In this embodiment, in a part of the optical fiber loop, a semiconductor optical amplifier (SOA) 61 as a gain medium is inserted and the polarization controllers 16*a* and 16*b* are inserted in the same manner as in the fifth embodiment shown in FIG. 11. This embodiment disposes, on both ends of the optical fiber loop, collimate lenses 101 and 102 in parallel to each other as shown in the figure. A spatial circulator element 103A is disposed, with an end surface thereof oriented perpendicularly to an optical axis of the collimate lenses 101 and 102. The circulator element 103A is an element constituting a light branch incidence section, to be described below, in which two branch mechanisms are to be combined in a compact size, with disposing a tunable filter 104 on the other end side thereof in the same manner as in the aforementioned embodiment. The tunable filter 104 may be composed of the polygon mirror 25, driver omitted from the illustration here, and diffraction grating 27 as in the first embodiment, or may alternatively be a tunable filter using the galvanometer as shown in the seventh embodiment.

Figure 17A:
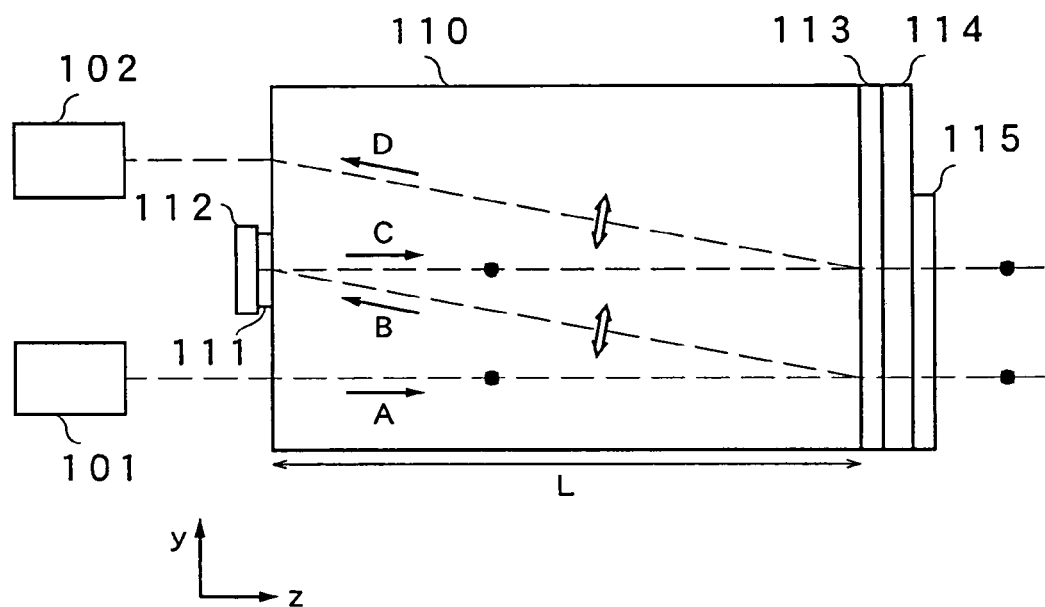
FIG. 17A shows a spatial circulator element and surrounding parts thereof according to the present embodiment in detail.

Next, FIG. 17A is a view showing the circulator element 103A and the surrounding parts thereof in detail. The circulator element 103A uses a doubly refracting crystal 110, a doubly refracting crystal of, for example, rutile, YVO$_4$, calcite, or the like, as shown in the figure. The doubly refracting crystal 110 is capable of separating a beam, within a main plane, as an ordinary ray for S-polarized light and as an extraordinary ray for P-polarized light from among polarization components orthogonal to the optical axis (z-axis) of the crystal. Assume that the length of this crystal 110 is L. Near a lower left end surface of this crystal, the collimate lens 101 is disposed so that light is inputted perpendicularly thereinto. On a central portion of the left end surface, as shown in the figure, a ¼ wavelength plate 111 and a reflection mirror, for example, a reflection mirror 112 of gold, are stacked in layers. Near an upper left end surface, the collimate lens 102 is disposed in symmetry with the collimate lens 101 as shown in the figure.

On the other surface of the doubly refracting crystal 110, i.e., a right end surface in this embodiment, a Faraday rotator 113, ½ wavelength plate 114, and polarizer 115 are stacked in layers. A magnetic field strength is selected so that the Faraday rotator 113 rotates polarization through 45-degree clockwise with respect to an axis of a magnetization direction. In this embodiment, the z-axis in the figure is defined as the magnetization direction. The ½ wavelength plate 114 is disposed with its fast axis arranged at 22.5-degree with respect to P-polarized light, and rotates polarization through 45-degreess counterclockwise (CCW) with respect to a travel direction of the light. The polarizer 115 transmits only S-polarization light components. The polygon mirror 25 is disposed on an optical axis of the collimate lens 101 that transmits light from the doubly refracting crystal 110. A position located slightly away from this area, for example, 2 mm thereabove, serves as a position where light from the polygon mirror 25 is inputted and outputted. From these two points, light is outputted in parallel to each other toward the polygon mirror 25.

Figure 17B:
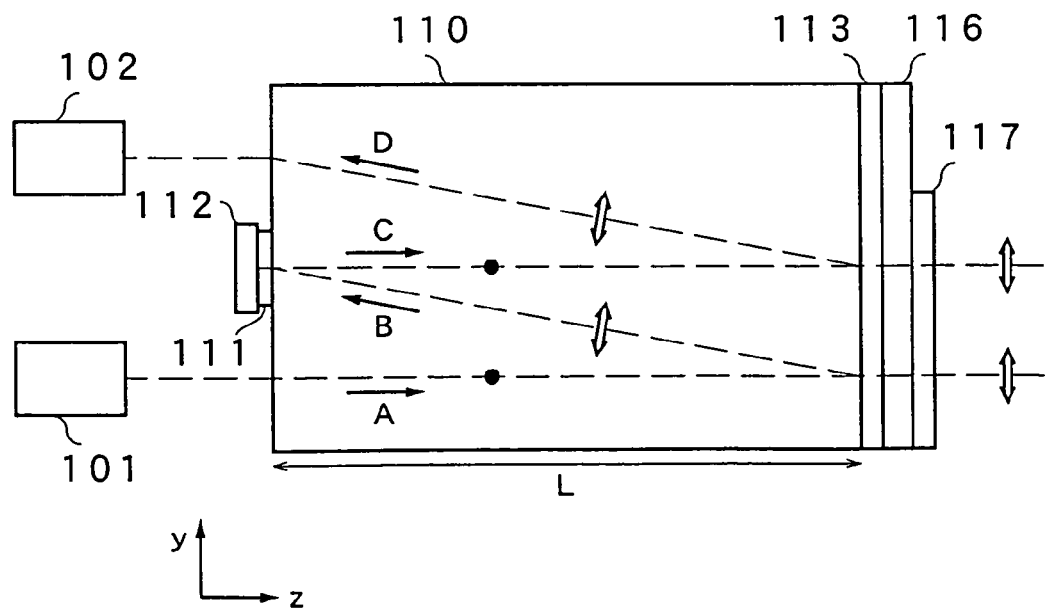
FIG. 17B shows a spatial circulator element and surrounding parts thereof according to a tenth embodiment of the present invention in detail.
Figure 18A:
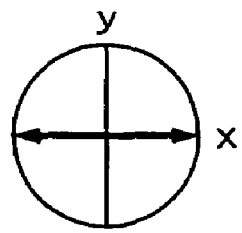
FIG. 18A in a view showing the change of polarization state of light when passing through the spatial circulator element.
Figure 18B:
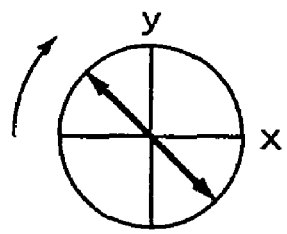
FIG. 18B in a view showing the change of polarization state of light when passing through the spatial circulator element.
Figure 18C:
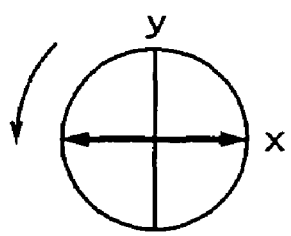
FIG. 18C in a view showing the change of polarization state of light when passing through the spatial circulator element.

Next, an operation of the tunable fiber laser light source will be described. Light from the optical fiber 11 is first collimated by the collimate lens 101 and inputted to the circulator element 103A from the lower left end surface. The light is defined as S-polarized light. FIG. 18A is a view showing this polarization state. In FIGS. 17A and 17B, S-polarized light is indicated by circles while P-polarized light is indicated by arrows perpendicular to the optical axis. The light, as shown by an arrow A in FIG. 17A, passes through the doubly refracting crystal 110 along the optical axis. The beam is separated, within a peripheral surface, as an ordinary ray for the S-polarized light and as an extraordinary ray for the P-polarized light from among polarization components orthogonal to this crystal axis. Thus, only the S-polarization component travels straight ahead and passes through the Faraday rotator 113, upon which the polarization is rotated through 45-degree clockwise with respect to the z-axis direction, i.e., the magnetization direction. FIG. 18B shows the polarization state of the light after passing through the Faraday rotator 113. Subsequently, upon passing through the ½ wavelength plate 114, the light is rotated through 45-degree counterclockwise with respect to the axis of the travel direction, that is, the z-axis. FIG. 18C shows the polarization state of this light in this condition. In this case, the S-polarization component inputted from collimate lens 101 is kept as it is, and thus passes directly through the polarizer 115 and is outputted to the tunable filter 104.

Figure 18D:
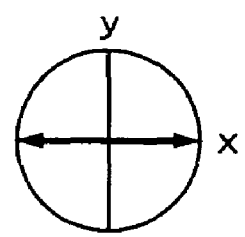
FIG. 18D in a view showing the change of polarization state of light when passing through the spatial circulator element.
Figure 18E:
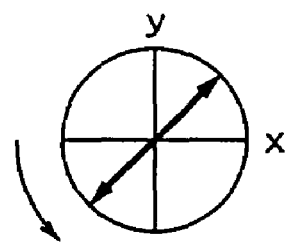
FIG. 18E in a view showing the change of polarization state of light when passing through the spatial circulator element.
Figure 18F:
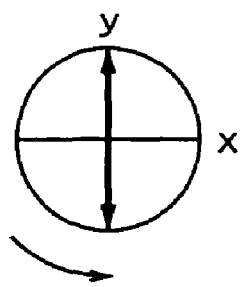
FIG. 18F in a view showing the change of polarization state of light when passing through the spatial circulator element.

After a wavelength is selected by the tunable filter 104, the light is directly inputted to the polarizer 115 along the same optical axis while the S-polarization component is maintained, as shown in FIG. 18D. Then, upon passing through the polarizer 115 and then through the ½ wavelength plate 114, the polarization state of the light is rotated through 45-degree counterclockwise with respect to the travel direction. FIG. 18E shows the polarization state of the light in this condition. Upon passing through the Faraday rotator 113, the light is rotated through 45-degree counterclockwise with respect to the axis of the travel direction since the magnetization direction and the travel direction are opposite each other. FIG. 18F shows the polarization state of the light. As a result, the light turns into a P-polarization component and penetrates the doubly refracting crystal 110. In the doubly refracting crystal 110, the P-polarized light is shifted as an extraordinary ray in the positive y-axis direction by a proportionate amount to the length L of the doubly refracting crystal, and then penetrates the ¼ wavelength plate 111 from the left end in the FIG. 17A perpendicularly to the end surface. Then the light is reflected at the mirror 112, passes again through the ¼ wavelength plate 111, and then is again inputted to the doubly refracting crystal 110, upon which the polarization direction is rotated through 90-degree by shutting in the ¼ wavelength plate 111, whereby the light is converted into S-polarized light. The light passes again through the doubly refracting crystal 110 in a direction of an arrow C. Then the light transmits through the Faraday rotator 113, ¼ wavelength plate 114, and polarizer 115 on the right end surface in the same manner as described above. The light is further inputted to the tunable filter 104, and its reflected light is outputted through the same path. The light again inputted to the doubly refracting crystal 110 turns into P-polarized light as in the aforementioned case, and is shifted in the positive y-axis direction upon transmitting therethrough in the direction of the arrow to thereby transmit through the doubly refracting crystal 110. Then the light is outputted from the left end surface, and returns to the optical fiber loop through the collimate lens 102. Thus, wavelength selectivity can be improved by passage of the light twice through the tunable filter 104, thereby allowing oscillation of laser light with a sharp characteristic.

As the optical fiber loop, in place of the optical fiber 11, the optical fiber 71 of a polarization maintaining type in the sixth embodiment may be used. In this case, the optical fiber 71 is disposed with its fast axis in correspondence with an S-polarization component on the collimate lens 101 side, and a P-polarization component is inputted to the collimate lens 102 in correspondence with the fast axis of the optical fiber 71. Thus, the polarization plane is maintained and the optical fiber loop is formed, thereby allowing laser oscillation. In this case, the polarization controllers 16a and 16b are not required.

Moreover, in this embodiment, on the right end surface of the doubly refracting crystal 110, the Faraday rotator 113 and ½ wavelength plate 114 are stacked in layers, but this order may be reversed. Further, the polarizer 115 may be omitted. In addition, the polarization direction at the Faraday rotator and the ½ wavelength plate may be reversed, and thus the P-polarized light and the S-polarized light may be all reversed.

Tenth Embodiment

Next, a tenth embodiment will be described with reference to FIG. 17B. This embodiment is almost the same as the ninth embodiment, but in addition to the Faraday rotator 113, a ½ wavelength plate 116 and polarization plate 117 are provided on the end surface of the doubly refracting crystal 110. The ½ wavelength plate 116 has a fast axis oriented at minus 22.5-degree with respect to P-polarized light, and polarizes light through 45-degree clockwise with respect to the travel direction of the light. The polarizer 117 transmits only P-polarization components. Construction of others in this embodiment is the same as that of those described above. In this case, light from the collimate lens 101 transmits through the doubly refracting crystal 110, the polarization of the light is rotated through 90-degree by the Faraday rotator 113 and ½ wavelength plate 116, and the light passes through the polarization plate 117 as P-polarized light and is then outputted to the tunable filter 104. This reflected light has the polarized state thereof maintained, and the P-polarized light is maintained when inputted again to the doubly refracting crystal 110. Thus, as shown in FIG. 17B, the light shifts in the positive y-direction and penetrates the ¼ wavelength plate 111 and reflection mirror 112. Other operation of this embodiment is the same as those described above, and thus, also in this case, inputting twice to the diffraction grating results in improving the light selectivity.

Eleventh Embodiment

Figure 19:
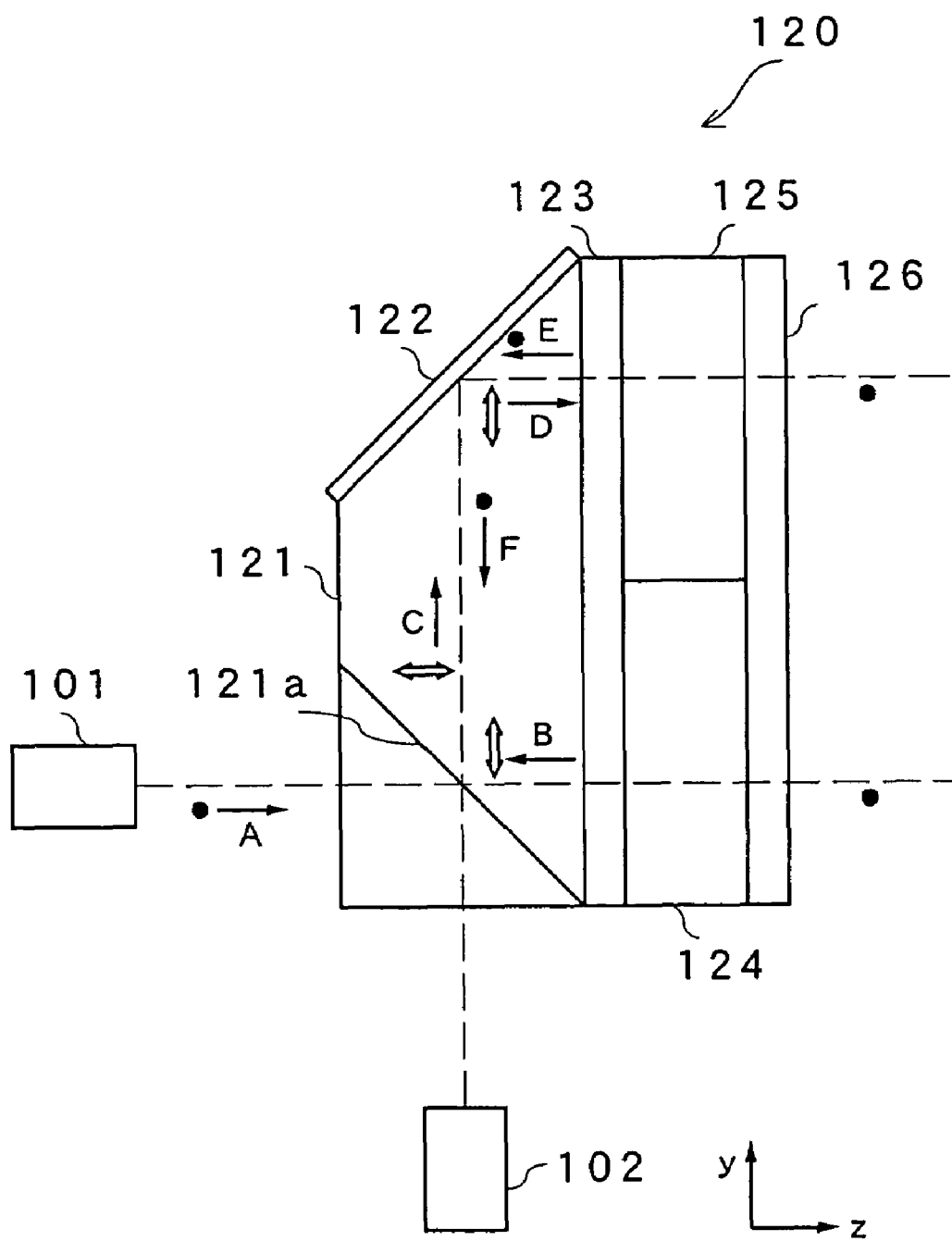
FIG. 19 shows a spatial circulator element and surrounding parts thereof according to a eleventh embodiment of the present invention in detail.

Next, an eleventh embodiment of the present invention will be described. FIG. 19 shows another example of a spatial circulator element of a tunable fiber laser light source according to this embodiment. Construction of others is the same as in the ninth embodiment. This spatial circulator element 120 has a polarization beam splitter 121 formed in a trapezoidal shape with a top surface thereof notched as shown in FIG. 19. In the polarization beam splitter 121, a polarized light splitting film 121a is formed, as shown in the figure, at 45-degree with respect to an optical axis of the collimate lens 101. This polarized light splitting film 121a transmits S-polarization components and reflects P-polarization components. To an upper slant surface of the polarization beam splitter 121, a reflection mirror 122 is attached. To the right side surface of the polarized beam splitter 121, a Faraday rotator 123 is attached, on a surface of which a first and a second ½ wavelength plates 124 and 125 are attached separately at its top and bottom thereof. On surfaces of the ½ wavelength plates 124 and 125, a polarizer 126 is configured to be stacked in layers. A magnetic flux strength is selected so that the Faraday rotator 123 rotates polarization through 45-degree clockwise with respect to a magnetization direction (z-axis direction). The lower ½ wavelength plate 124 is disposed with a fast axis arranged at 22.5-degree with respect to P-polarized light, and rotates polarization through 45-degree counterclockwise (CCW direction) with respect to a travel direction of the light. The upper ½ wavelength plate 125 is disposed with a fast axis arranged at minus 22.5-degree with respect to P-polarized light, and rotates polarization through 45-degree clockwise with respect to the travel direction of light. The polarizer 126 transmits only S-polarization components.

Next, an operation of this tunable fiber laser light source will be described. Light from the optical fiber 11 of the optical fiber ring penetrates the polarization beam splitter 121 through the collimate lens 101. Assuming that a component of this light is defined as S-polarization component, a polarization state thereof is shown in FIG. 18A. This S-polarization component transmits through the polarization beam splitter 121 and passes through the Faraday rotator 123, and, in this condition, is rotated through 45-degree clockwise with respect to an axis of the travel direction thereof, turning into a state shown in FIG. 18B. Next, the light is rotated through 45-degree by the ½ wavelength plate 124 counterclockwise with respect to the axis of the travel direction, turning into a state shown in FIG. 18C. As a result, the rotations are canceled each other, and the light maintaining S-polarization component transmits through the polarizer 126 and is inputted to the tunable filter 104. In the tunable filter 104, reflected light of a selected wavelength is kept intact as S-polarization component, and is inputted again to the circulator element 120 through the same optical path. A polarization state in this condition is shown in FIG. 18D. The light passing through the polarizer 126 is rotated through 45-degree by the ½ wavelength plate 124 counterclockwise with respect to the travel direction, turning into a state shown in FIG. 18E. Further, since the magnetization direction and the travel direction are opposite each other when the light passes through the Faraday rotator 123, the light is rotated through 45-degree counterclockwise with respect to the axis of the travel direction, turning into a state of FIG. 18F. That is, the light turns into a P-polarization component, and is inputted to the polarization beam splitter 121 as shown by an arrow B. Then, the light is reflected at the polarized light splitting film 121*a*, and transmits through the polarization beam splitter 121 upward in the figure as shown by an arrow C. The light then is reflected at the reflection mirror 122 located above the polarization beam splitter 121, and the reflected light is oriented in a direction of an arrow D and penetrates the Faraday rotator 123. In this condition, the reflected light is rotated through 45-degree clockwise by the Faraday rotator 123, then also is rotated through 45-degree clockwise by the ½ wavelength plate 125 to be converted into a S-polarization component. Since this light is S-polarized light, it transmits directly through the polarizer 126 and is inputted to the tunable filter 104. Light of a selected wavelength in the tunable filter 104 is inputted again to the circulator element 120 while maintaining the S-polarization state. This light transmits through the polarizer 126, is rotated through 45-degree by the ½ wavelength plate 125 clockwise with respect to the travel direction, and is rotated through 45-degree by the Faraday rotator 123 with respect to the magnetization direction, that is, counterclockwise with respect to the travel direction, so that the rotations are canceled each other, the light transmits as shown by an arrow E while maintaining the original S-polarization component, and then is reflected at the reflection mirror 122. Then the light passes through an arrow F, transmits through the polarized light separating film 121*a*, transmits directly through a bottom surface of the polarization beam splitter 121, and is outputted to the collimate lens 102. This output penetrated the optical fiber 11 of the fiber loop. Accordingly, the light passes twice through the tunable filter, thereby allowing oscillation of laser light with a sharp characteristic.

In this embodiment, the optical fiber 71 of a polarization maintaining type can be used as an optical fiber loop in place of the optical fiber 11 as in the sixth the embodiment. In this case, the optical fiber 71 is arranged so that its fast axis corresponds to S-polarization component on the collimate lens 101 side, and a P-polarization component is inputted to the collimate lens 102 in correspondence with the fast axis of the optical fiber 71. Accordingly, the polarization plane is maintained and an optical fiber loop is formed, thereby allowing laser oscillation. In this case, the polarization controller 16*a* and 16*b* are not required in this embodiment.

In this embodiment, the rotator 123 and the ½ wavelength plates 124 and 125 are stacked in layers on the right end surface of the polarization beam splitter 121, but this arrangement order may be reversed. Moreover, the polarizer 126 may be omitted. Further, the polarization direction of light at the Faraday rotator and the ½ wavelength plate may be reversed, and also P-polarized light and S-polarized light may be all reversed.

In this manner, when a circulator element is used, it can be shortened by a fiber length compared to when an optical-fiber-type circulator is used. Therefore, the resonator length of the fiber ring can be shortened, thereby allowing suppressing thickening of a line width at fast wavelength sweep. Moreover, the use of this element automatically collimates a folded beam provided twice, thereby allowing accurately conforming to the center wavelength of the filter of the diffraction grating.

Twelfth Embodiment

Figure 20:
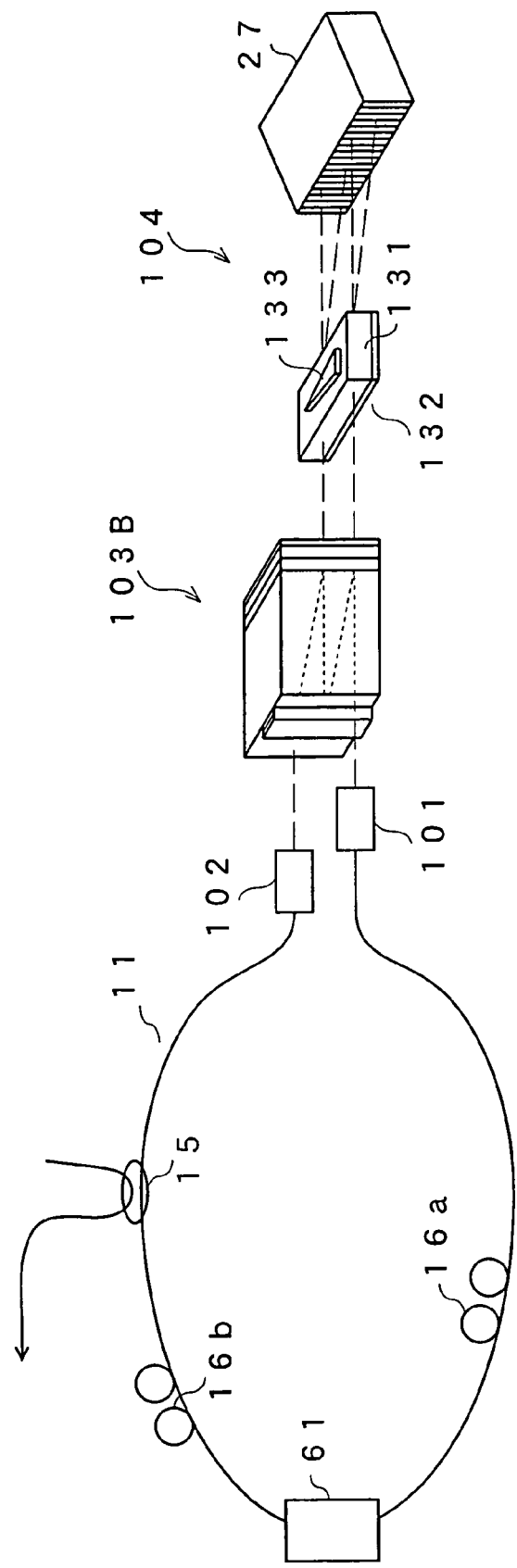
FIG. 20 is a schematic view showing a tunable fiber laser light source according to a twelfth embodiment of the present invention.

Next, a twelfth embodiment of the present invention will be described. FIG. 20 shows the overall configuration of this embodiment. In this embodiment, the same portions as those of the aforementioned tenth embodiment are provided with the same numerals, and thus a detailed description thereof will be omitted. In this embodiment, the collimate lenses 101 and 102 are located at the end portion of the optical fiber loop, and a circulator element is disposed on the optical axis. In this embodiment, the spatial circulator element 103B shown in FIG. 17B is used. That is, light outputted to an optical beam deflector is set as P-polarized light by using the ½ wavelength plate 116 and polarizer 117. In this embodiment, in place of the polygon mirror 25, a nonlinear crystal element is provided as the optical beam deflector of the tunable filter as shown in the figure. This nonlinear crystal element has, for example, a lower electrode 132 and upper electrode 133 of a trapezoidal or triangular shape stacked in layers on a crystal 131 having electro-optic effect. The material used for this crystal is PZT, $LiNbO_3$, or the like. Through the application of a voltage between the electrodes 132 and 133, a refractive index of the nonlinear crystal 131 changes only at a portion immediately below the upper electrode in accordance with the applied voltage. Thus, by appropriately changing the voltage to be applied, light can be deflected at a refractive angle in accordance with the voltage. On this output side, the aforementioned diffraction grating 27 is provided. Construction of others is the same as in the tenth embodiment.

Next, an operation of this embodiment will be described. As in the aforementioned tenth embodiment, from the polarizer 117 attached to the doubly refracting crystal of the circulator element 103B, light of a P-polarization component is inputted to the electro-optic element 132 of the optical beam deflector. In this condition, the light is refracted at an angle in accordance with a refractive index selected by the voltage, and then penetrates the diffraction grating 27. In this case, the light returns to the circulator element 103B through the same optical path. The wavelength selection by the diffraction grating 27 is repeated for two parallel lights in the same manner as shown in the figure, which contributes to improve the wavelength selectivity. In this case, unlike when the polygon mirror 25 is used, an arbitrary characteristic of wavelength change can be obtained by appropriately selecting the voltage applied between the electrode 133 and the base 131.

In this embodiment, an electro-optic element is used, but an element may be alternatively used which is capable of providing either of thermo-optic effect and acousto-optic effect.

Thirteenth the Embodiment

Figure 21:
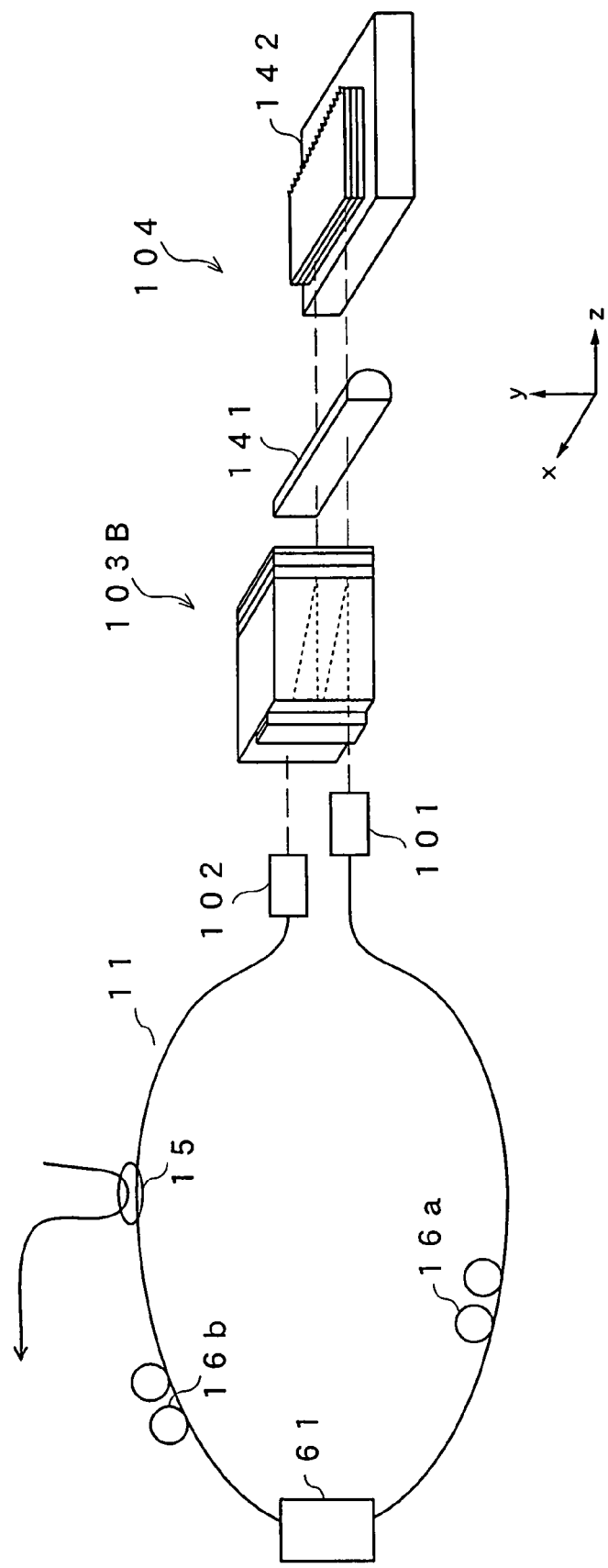
FIG. 21 is a schematic view showing a tunable fiber laser light source according to a thirteenth embodiment of the present invention.

Next, a thirteenth embodiment of the present invention will be described with reference to FIGS. 21 and 22. In this embodiment, the circulator element 103B in the tenth embodiment is used, and on the output side thereof, a cylindrical lens 141 and optical waveguide element 142 are provided. The cylindrical lens 141 focuses light from the circulator element 103B in a y-axis direction and inputs it to the waveguide element 142. The waveguide element 142 has a slab waveguide structure in which a clad, core, clad are stacked in layers on a base 143, and is formed of a nonlinear material. The waveguide element has a function of an optical beam deflector 144 and diffraction grating 145. The optical beam deflector 144 has an electrode provided at a hatched area shown in FIG. 22, and changes a refractive index of the waveguide element 142 immediately below the electrode through application of a voltage from a voltage source and thereby continuously deflects the light in accordance with the voltage. The diffraction grating 145 is formed on an end surface of the waveguide element 142.

Next, an operation of this embodiment will be described. As in the aforementioned tenth embodiment, light of a P-polarization component from the circulator element 103B penetrated the waveguide element 142 through the cylindrical lens 141. On the optical beam deflector 144 of the waveguide element 142, the light is deflected with a voltage in accordance with the applied voltage, and penetrates the diffraction grating 145 on the end surface. Then, the light reflected from diffraction grating 145 returns to the circulator element 103B through the same path namely through the optical beam deflector 144 and cylindrical lens 141 while maintaining the P-polarization state. Thus, this path is repeated twice as shown in the figure, and the light is inputted twice to the diffraction grating 145, which contributes improvement wavelength selectivity of light. In this embodiment, by collecting the light deflector and the diffraction grating together in the waveguide element, downsizing can be achieved and also optical axis can be adjusted easily.

The present invention can obtain a laser light source with a comparatively simple configuration and tunable wavelength at high speed with the use of the diffraction grating, thereby allowing for use in a medical analyzer such as a medical imaging system based on optical coherence tomography with high-resolution for lower epidermis. Further, the tunable fiber laser light source according to the present invention can be used as a light source in the case of measuring the temporal change of strain in a fiber grating sensor system.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application No. 2005-051105 filed on Feb. 25, 2005 is hereby incorporated by reference.

What is claimed is:

1. A tunable fiber laser light source comprising:
an optical fiber loop which serves as an optical path of laser oscillation;
a gain medium which is connected to said optical fiber loop and has a gain with respect to an oscillating wavelength;
a light branch incident section which divides a plurality of light from said optical fiber loop and returns light to said optical fiber loop through the same optical path as the divided light;
a tunable optical filter which receives the plurality of divided light divided by said light branch incident section, selects each same wavelength continuously changed, and supplies light of the selected wavelength said light branch incident section through the same optical path; and
an optical coupler which is connected to said optical fiber loop and takes out a part of light passing through said optical fiber loop, wherein
said tunable optical filter includes:
an optical beam deflector which periodically changes a reflecting angle of an optical beam, obtained from said light branch incident section, within a certain range; and
a diffraction grating which receives light deflected by said optical beam deflector and reflects light of selected wavelength changing according to an incident angle in the same direction as the incident angle; and
wherein said light branch incident section is a spatial circulator element, and said spatial circulator element comprises:
a doubly refracting crystal;
a ¼ wavelength plate which is formed at a central portion of a first surface of said doubly refracting crystal;
a reflection plate which is stacked on said ¼ wavelength plate;
a Faraday rotator which rotates polarization through 45-degrees in opposite directions to each other with respect to light from said first surface to said second surface and light from said second surface to said first surface; and
a ½ wavelength plate which, when light transmits therethrough, rotates polarization through 45-degrees in the same direction as either of the directions of rotation by said Faraday rotator;
wherein one of said Faraday rotator and said ½ wavelength plate is stacked on a second surface opposing said first surface of said doubly refracting crystal and the other of said Faraday rotator and said ½ wavelength plate is stacked on said one of said Faraday rotator and said ½ wavelength plate which is stacked on the second surface.

2. The tunable fiber laser light source according to claim 1, wherein
said light branch incident section is of first and second three-port type optical circulators each of which has two terminals connected to said optical fiber loop.

3. The tunable fiber laser light source according to claim 1, wherein
said light branch incident section is of a four-port type optical circulator connected to said optical fiber loop, first and fourth terminals of said optical circulator are connected to said optical fiber loop, and second and third terminals of said optical circulator are connected in parallel to said tunable filter, respectively.

4. The tunable fiber laser light source according to claim 1, wherein
said light branch incident section includes:
a first optical circulator which is connected to said optical fiber loop; and
a second optical circulator which is connected to an emitting side of said optical coupler and divides a part of emitted light to input to said tunable filter.

5. The tunable fiber laser light source according to claim 1, wherein
said optical fiber loop is configured to include an optical fiber of polarization maintaining type.

6. The tunable fiber laser light source according to claim 1, wherein
said gain medium is an optical fiber amplifier which constitutes a part of said optical fiber loop.

7. The tunable fiber laser light source according to claim 1, wherein
said gain medium is a semiconductor light amplifier which amplifies light.

8. The tunable fiber laser light source according to claim 1, wherein
said optical fiber loop further includes a polarization controller which regulates a polarization direction of light passing through the optical fiber loop to a certain direction.

9. The tunable fiber laser light source according to claim 1, wherein
said optical beam deflector in said tunable optical filter includes:
a polygon mirror which is disposed on a light axis emitted from said optical fiber and has a plurality of reflecting faces for changing a light reflecting angle by rotation; and
a driver which rotates said polygon minor for changing light reflecting angle.

10. The tunable fiber laser light source according to claim 1, wherein
said optical beam deflector in said tunable optical filter includes:

a mirror which is disposed on a light axis emitted from said optical fiber loop and changes a light reflecting angle by rotation; and a galvanometer which pivots said mirror at a certain angle range.

11. The tunable fiber laser light source according to claim 1, wherein said tunable filter further includes a beam expander which enlarges a beam diameter of a optical beam polarized by said optical beam deflector; and said beam expander increases an enlargement rate as selected wavelength is shortened.

12. The tunable fiber laser light source according to claim 11, wherein said beam expander includes:

a first beam expander which is disposed in front of said optical beam deflector and enlarges an optical beam diameter; and a second beam expander which enlarges the optical beam diameter obtained from said first beam expander.

13. The tunable fiber laser light source according to claim 1, wherein an optical beam deflector of said tunable optical filter is a deflecting element which employs any of non-linear optical effects including an electro-optic effect, magneto-optic effect, thermo-optic effect, and acousto-optic effect.

14. The tunable fiber laser light source according to claim 1, wherein said tunable optical filter has an optical beam deflector which is formed on an optical waveguide and a diffraction grating which is formed on an end surface of said light waveguide.

15. The tunable fiber laser light source according to claim 14, wherein said optical waveguide has a slab waveguide structure.

* * * * *